US012646576B2

(12) United States Patent
Fujita et al.

(10) Patent No.: US 12,646,576 B2
(45) Date of Patent: Jun. 2, 2026

(54) BITSCAN TECHNIQUES IN A MEMORY DEVICE

(71) Applicant: Sandisk Technologies, Inc., Milpitas, CA (US)

(72) Inventors: Yuki Fujita, Yokohama (JP); Kei Kitamura, Chigasaki (JP); Takayuki Inoue, Fujisawa (JP)

(73) Assignee: Sandisk Technologies, Inc., Milpitas, CA (US)

( * ) Notice: Subject to any disclaimer, the term of this patent is extended or adjusted under 35 U.S.C. 154(b) by 196 days.

(21) Appl. No.: 18/389,982

(22) Filed: Dec. 20, 2023

(65) Prior Publication Data

US 2025/0210117 A1 Jun. 26, 2025

(51) Int. Cl.
*G11C 16/10* (2006.01)
*G11C 16/34* (2006.01)

(52) U.S. Cl.
CPC ........ *G11C 16/3459* (2013.01); *G11C 16/102* (2013.01); *G11C 16/3404* (2013.01)

(58) Field of Classification Search
CPC .............. G11C 16/3459; G11C 16/102; G11C 16/3404; G11C 11/5628; G11C 16/0483; G11C 16/10; G11C 29/00
See application file for complete search history.

(56) References Cited

U.S. PATENT DOCUMENTS

| | | | |
|---|---|---|---|
| 8,830,745 B2 | 9/2014 | Mui et al. | |
| 10,290,360 B2 | 5/2019 | Chan | |
| 11,217,318 B2 | 1/2022 | Choi et al. | |
| 11,581,028 B2 | 2/2023 | Chai | |
| 2010/0097855 A1* | 4/2010 | Bayle ................. | G11C 16/0483 365/185.24 |
| 2019/0122741 A1 | 4/2019 | Cheng et al. | |
| 2023/0343398 A1* | 10/2023 | Dong ..................... | G11C 16/10 |

* cited by examiner

*Primary Examiner* — Xiaochun L Chen
(74) *Attorney, Agent, or Firm* — Dickinson Wright PLLC

(57) ABSTRACT

The memory device includes a memory block with an array of memory cells that are arranged in a plurality of word lines. The memory device also includes circuitry that is configured to program the memory cells of a selected word line of the plurality of word lines in a plurality of program loops. During at least one of the program loops, the circuitry is configured to apply a programming pulse and at least one verify pulse to the selected word line, then determine a number of memory cells to be verified to establish a verify count, and then compare the verify count to a predetermined threshold count. The circuitry then sets at least one bit scan pass fail (BSPF) criteria based on the comparison of the verify count to the predetermined threshold count.

20 Claims, 19 Drawing Sheets

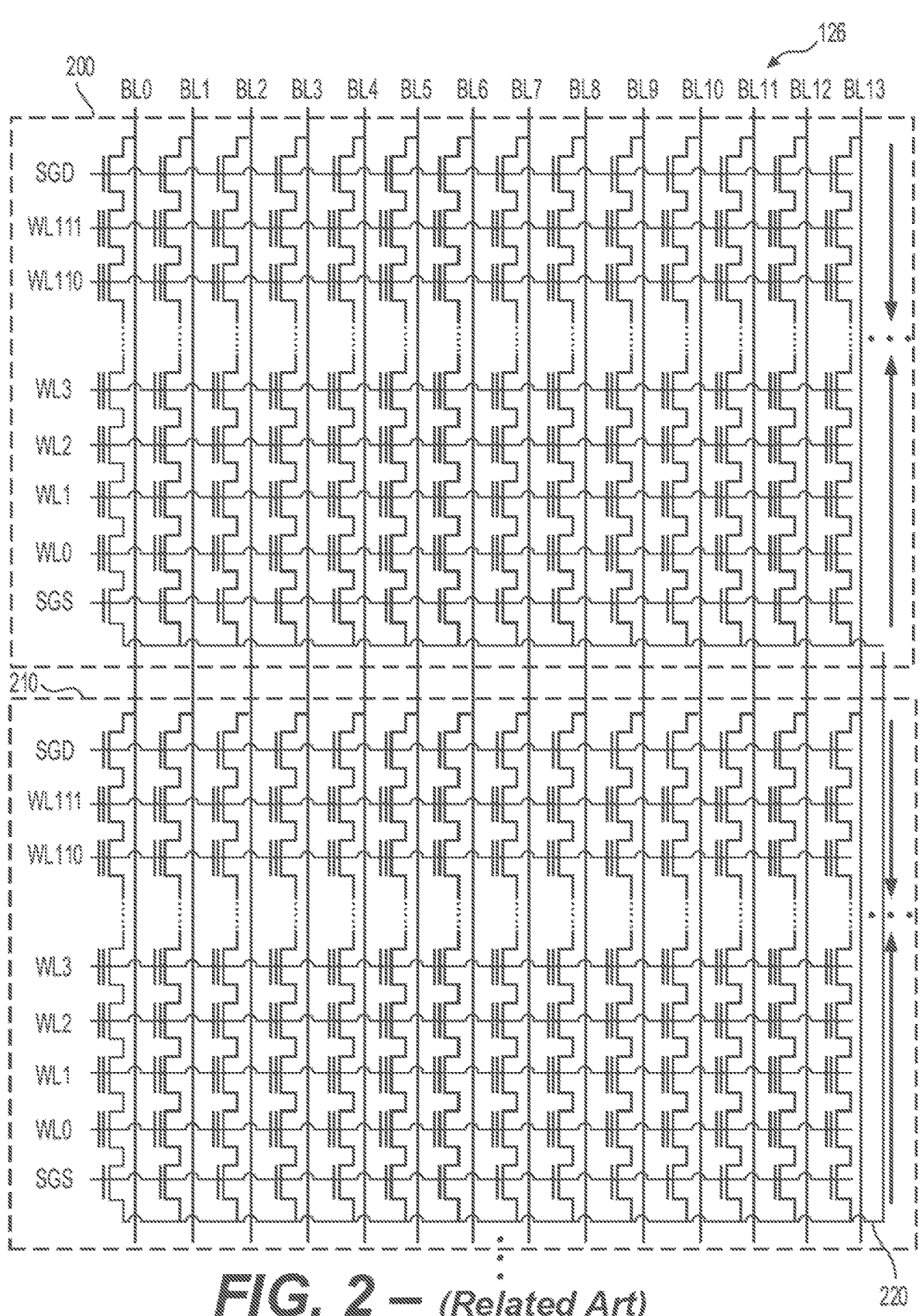
*FIG. 2 — (Related Art)*

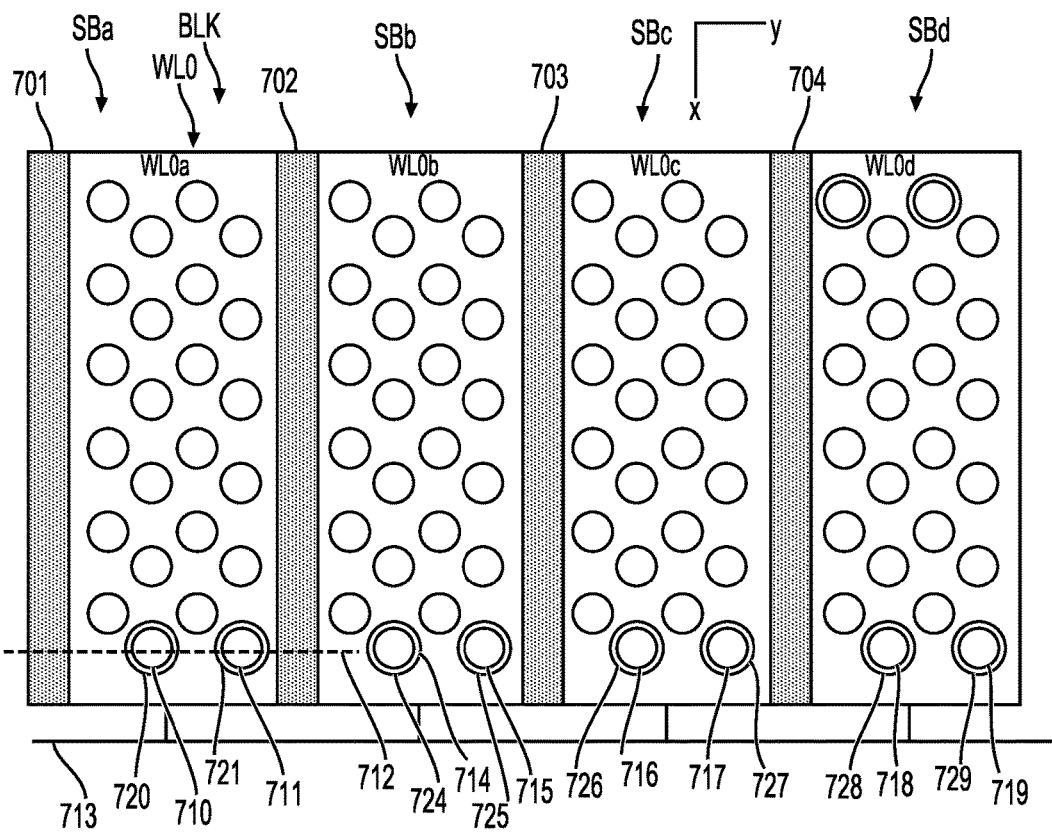
FIG. 7A – (Related Art)
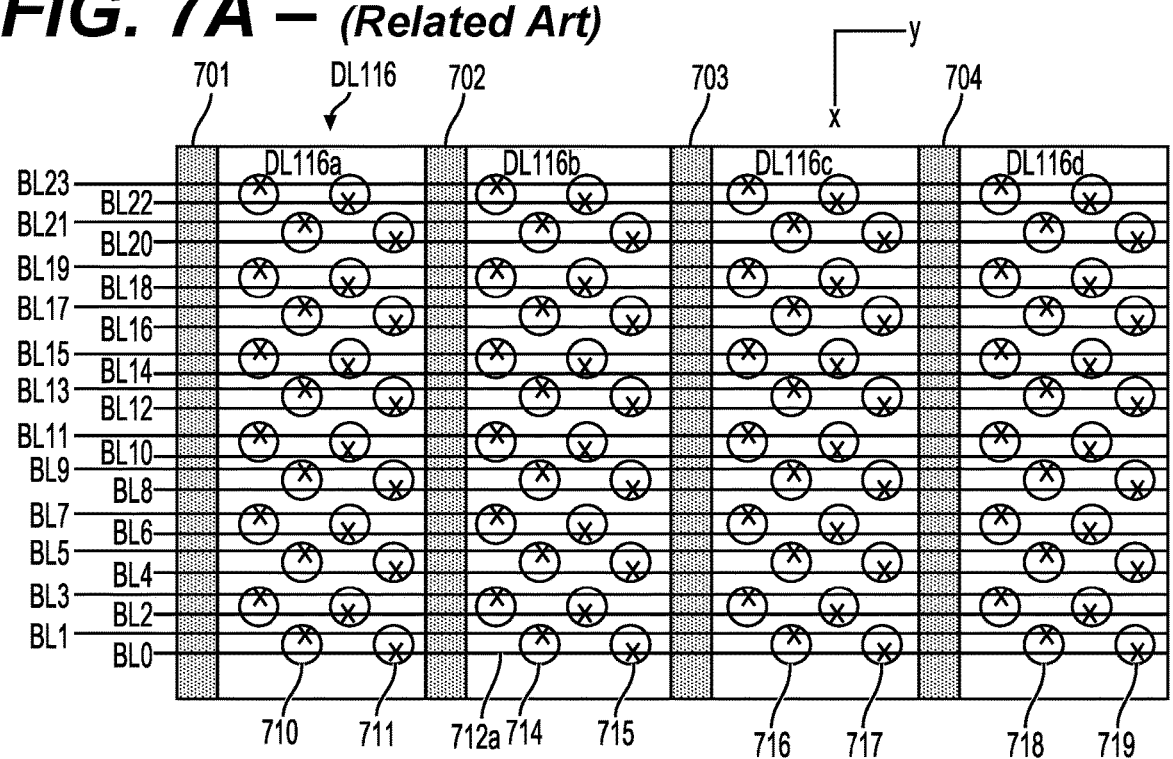
FIG. 7B - (Related Art)

1300

1302  BEGIN VERIFYING DATA STATE Sn

1304  APPLY PROGRAMMING PULSE TO WLn;
COUNT MEMORY CELLS BEING
PROGRAMMED TO Sn
TO ESTABLISH C_n

1306  IS C_n > T_SPCV?

NO

YES

1308  SET BSPF_SPV = BSPF_SPCV_H

1310  SET BSPF_SPCV = BSPF_SPCV_L

1312  CONTINUE PROGRAMMING WLn;
BEGIN VERIFYING DATA STATE Sn+1 WHEN
BITSCAN FAILS

BEGIN PROGRAMMING WLn

1402

APPLY PROGRAMMING PULSE TO WLn;
COUNT MEMORY CELLS TO BE VERIFIED
IN SMART VERIFY OPERATION

1404

IS C_SV > T_SV?

1406

YES

SET BSPF_SV = BSPF_SV_H

1408

NO

SET BSPF_SPV = BSPF_SV_L

1410

CONTINUE PROGRAMMING WLn;
VERIFY USING Vsv; UPON PASSING VERIFY,
SET VPGM_SV = VPGM;
COMPLETE PROGRAMMING WLn

| ZONE # | BIT COUNT MIN | BIT COUNT MAX | DECREASE/INCREASE BSPF_SPCV |
|---|---|---|---|
| 1 | N/A | U*1.5/8 | BSPF_SPCV = 1/8 |
| 2 | U*1.5/8 | U*2.5/8 | BSPF_SPCV = 2/8 |
| 3 | U*2.5/8 | U*3.5/8 | BSPF_SPCV = 3/8 |
| 4 | U*3.5/8 | U*4.5/8 | BSPF_SPCV = 4/8 |
| 5 | U*4.5/8 | U*5.5/8 | BSPF_SPCV = 5/8 |
| 6 | U*5.5/8 | U*6.5/8 | BSPF_SPCV = 6/8 |
| 7 | U*6.5/8 | U*7.5/8 | BSPF_SPCV = 7/8 |
| 8 | **U*7.5/8 | U*8.5/8 | BSPF_SPCV = 8/8** |
| 9 | U*8.5/8 | U*9.5/8 | BSPF_SPCV = 9/8 |
| 10 | U*9.5/8 | U*10.5/8 | BSPF_SPCV = 10/8 |
| 11 | U*10.5/8 | U*11.5/8 | BSPF_SPCV = 11/8 |
| 12 | U*11.5/8 | U*12.5/8 | BSPF_SPCV = 12/8 |
| 13 | U*12.5/8 | U*13.5/8 | BSPF_SPCV = 13/8 |
| 14 | U*13.5/8 | U*14.5/8 | BSPF_SPCV = 14/8 |
| 15 | U*14.5/8 | U*15.5/8 | BSPF_SPCV = 15/8 |
| 16 | U*15.5/8 | N/A | BSPF_SPCV = 16/8 |

BITSCAN TECHNIQUES IN A MEMORY DEVICE

BACKGROUND

1. Field

The subject disclosure is related generally to improved techniques for programming data in a memory device to increase performance with a minimal or zero loss in reliability.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed.

SUMMARY

One aspect of the present disclosure is related to a method of performing a programming operation in a memory device. The method includes the step of preparing a memory block that includes an array of memory cells that are arranged in a plurality of word lines. In a program loop that includes the application of a programming pulse and at least one verify pulse to a selected word line, the method continues with the step of determining a number of memory cells to be verified to establish a verify count. The method proceeds with the step of comparing the verify count to a predetermined threshold count. The method continues with the step of setting at least one bit scan pass fail (BSPF) criteria based on the comparison of the verify count to the predetermined threshold count.

According to another aspect of the present disclosure, the at least one BSPF criteria is a smart verify BSPF criteria BSPF_SV.

According to yet another aspect of the present disclosure, the step of setting the smart verify BSPF criteria BSPF_SV based on the verify count to the predetermined threshold count includes: in response to the verify count being less than the predetermined threshold count, setting the smart verify BSPF criteria BSPF_SV at a low level BSPF_SV_L and in response to the verify count being greater than the predetermined threshold count, setting the smart verify BSPF criteria BSPF_SV at a high level BSPF_SV_H. The high level BSPF_SV_H is greater than the low level BSPF_SV_L.

According to still another aspect of the present disclosure, the at least one verify pulse is at a smart verify voltage. The method also includes the steps of performing a bitscan operation to count a number of memory cells in the selected word line that have threshold voltages below the smart verify voltage and comparing the number of memory cells that have threshold voltages below the smart verify voltage to the smart verify BSPF criteria BSPF_SV. In response to the number of memory cells that have threshold voltages below the smart verify voltage being greater than the smart verify BSPF criteria BSPF_SV, the method continues with the step of performing another program loop with at least one verify pulse at the smart verify voltage. In response to the number of memory cells that have threshold voltages below the smart verify voltage being less than the smart verify BSPF criteria VSPF_SV, the method proceeds with the step of setting a programming voltage VPGM as a smart verify voltage SV_VPGM to be used as an initial programming voltage during programming of other word lines of the plurality of word lines.

According to a further aspect of the present disclosure, the at least one BSPF criteria is a smart PCV criteria BSPF_SPCV.

According to yet a further aspect of the present disclosure, the step of setting the smart PCV criteria BSPF_SPCV based on the verify count to the predetermined threshold count includes, in response to the verify count being less than the predetermined threshold count, setting the smart PCV criteria BSPF_SPCV at a low level BSPF_SPCV_L. In response to the verify count being greater than the predetermined threshold count, the method proceeds with the step of setting the smart PCV criteria BSPF_SPCV at a high level BSPF_SPCV_H. The high level BSPF_SPCV_H is greater than the low level BSPF_SPCV_L.

According to still a further aspect of the present disclosure, the at least one verify pulse is a first verify voltage that is associated with a first programmed data state. The method further includes the step of performing a bitscan operation to count a number of memory cells in the selected word line that have threshold voltages below the first verify voltage. The method proceeds with the step comparing the number of memory cells that have threshold voltages above the first verify voltage to the smart PCV BSPF criteria BSPF_SPCV. In response to the number of memory cells that have threshold voltages above the first verify voltage being greater than the smart PCV BSPF criteria BSPF_SPCV, the method continues with the step of beginning verify of a second programmed data state in a next program loop. The second programmed data state is associated with a voltage range that is higher than the first programmed data state. In response to the number of memory cells that have threshold voltages above the first verify voltage being less than the smart PCV BSPF criteria BSPF_SPCV, the method proceeds with not beginning verify of the second programmed data state in the next program loop.

According to another aspect of the present disclosure, the step of determining the number of memory cells to be verified to establish the verify count at least partially occurs during the application of the programming pulse to the selected word line.

Another aspect of the present disclosure is related to a memory device that includes a memory block with an array of memory cells that are arranged in a plurality of word lines. The memory device also includes circuitry that is configured to program the memory cells of a selected word line of the plurality of word lines in a plurality of program loops. During at least one of the program loops, the circuitry is configured to apply a programming pulse and at least one verify pulse to the selected word line, then determine a number of memory cells to be verified to establish a verify count, and then compare the verify count to a predetermined threshold count. The circuitry then sets at least one bit scan pass fail (BSPF) criteria based on the comparison of the verify count to the predetermined threshold count.

According to another aspect of the present disclosure, the at least one BSPF criteria is a smart verify BSPF criteria BSPF_SV.

According to yet another aspect of the present disclosure, while setting the smart verify BSPF criteria BSPF_SV based on the verify count to the predetermined threshold count, the circuitry is configured to, in response to the verify count being less than the predetermined threshold count, set the smart verify BSPF criteria BSPF_SV at a low level BSPF_SV_L, and in response to the verify count being greater than the predetermined threshold count, set the smart verify BSPF criteria BSPF_SV at a high level BSPF_SV_H. The high level BSPF_SV_H is greater than the low level BSPF_SV_L.

According to still another aspect of the present disclosure, the at least one verify pulse is at a smart verify voltage. The circuitry is further configured to perform a bitscan operation to count a number of memory cells in the selected word line that have threshold voltages below the smart verify voltage and compare the number of memory cells that have threshold voltages below the smart verify voltage to the smart verify BSPF criteria BSPF_SV. In response to the number of memory cells that have threshold voltages below the smart verify voltage being greater than the smart verify BSPF criteria BSPF_SV, the circuitry performs another program loop with at least one verify pulse at the smart verify voltage. In response to the number of memory cells that have threshold voltages below the smart verify voltage being less than the smart verify BSPF criteria VSPF_SV, the circuitry sets a programming voltage VPGM as a smart verify voltage SV_VPGM to be used as an initial programming voltage during programming of other word lines of the plurality of word lines.

According to a further aspect of the present disclosure, the at least one BSPF criteria is a smart PCV criteria BSPF_SPCV.

According to yet a further aspect of the present disclosure, when setting the smart PCV criteria BSPF_SPCV based on the verify count to the predetermined threshold count, the circuitry is configured to, in response to the verify count being less than the predetermined threshold count, set the smart PCV criteria BSPF_SPCV at a low level BSPF_SPCV_L, and in response to the verify count being greater than the predetermined threshold count, set the smart PCV criteria BSPF_SPCV at a high level BSPF_SPCV_H. The high level BSPF_SPCV_H is greater than the low level BSPF_SPCV_L.

According to still a further aspect of the present disclosure, the at least one verify pulse is a first verify voltage that is associated with a first programmed data state. The circuitry is further configured to perform a bitscan operation to count a number of memory cells in the selected word line that have threshold voltages below the first verify voltage and compare the number of memory cells that have threshold voltages above the first verify voltage to the smart PCV BSPF criteria BSPF_SPCV. In response to the number of memory cells that have threshold voltages above the first verify voltage being greater than the smart PCV BSPF criteria BSPF_SPCV, the circuitry is configured to begin verify of a second programmed data state in a next program loop, the second programmed data state being associated with a voltage range that is higher than the first programmed data state. In response to the number of memory cells that have threshold voltages above the first verify voltage being less than the smart PCV BSPF criteria BSPF_SPCV, the circuitry is configured to not begin verify of the second programmed data state in the next program loop.

According to another aspect of the present disclosure, the circuitry is configured to determine the number of memory cells to be verified to establish the verify count at least partially simultaneous to the application of the programming pulse to the selected word line.

Yet another aspect of the present disclosure is related to an apparatus that includes a memory block with an array of memory cells that are arranged in a plurality of word lines. The apparatus also includes a programming means for programming the memory cells of a selected word line of the plurality of word lines in a plurality of program loops. During at least one of the program loops, the programming means is configured to apply a programming pulse and at least one verify pulse to the selected word line, determine a number of memory cells to be verified to establish a verify count, compare the verify count to a predetermined threshold count, and set at least one bit scan pass fail (BSPF) criteria as one of at least two BSPF criteria options based on the comparison of the verify count to the predetermined threshold count.

According to another aspect of the present disclosure, the at least one BSPF criteria is a smart verify BSPF criteria BSPF_SV.

According to yet another aspect of the present disclosure, the at least one BSPF criteria is a smart PCV criteria BSPF_SPCV.

According to still another aspect of the present disclosure, the circuitry is configured to determine the number of memory cells to be verified to establish the verify count at least partially simultaneous to the application of the programming pulse to the selected word line.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

FIG. 15 is a threshold voltage distribution plot of a plurality of memory cells during two program loops of an example smart verify operation;

FIG. 16 is a plot of programming time (inverse to performance) versus fail bit count (a measure of reliability) using three different programming techniques including a conservative technique, an aggressive technique, and a technique that utilizes a dynamically acquired BSPF criteria; and FIG. 17 is a table depicting a plurality of zones, their bit count ranges, and an increase or decrease from a baseline BSPF threshold for each zone.

DESCRIPTION OF THE ENABLING EMBODIMENTS

The present disclosure is related to programming techniques that improve performance with minimal or no reduction in reliability by dynamically setting a bitscan pass fail (BSPF) criteria that is used during certain operations based on a count of memory cells that are going to be verified in an ensuing verify operation. As discussed in further detail below, according to some embodiments, these operations are a smart PCV operation and a smart verify operation.

Figures 1A, 1B:
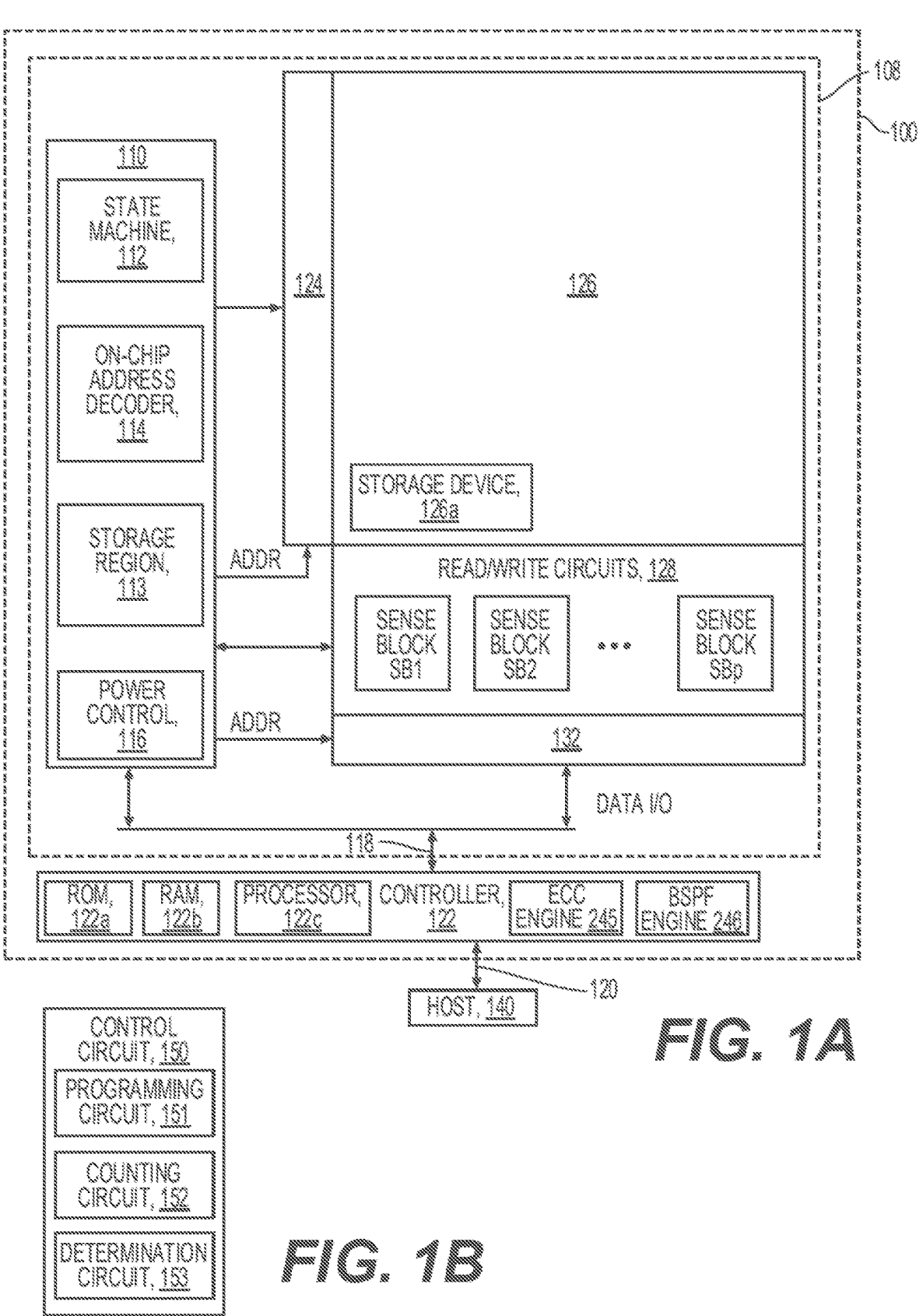
FIG. 1A is a block diagram of an example memory device.
FIG. 1B is a block diagram of an example control circuit.

FIG. 1A is a block diagram of an example memory device 100 is configured to program the memory cells in the word lines of a memory block according to the programming techniques of the subject disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits 150 can include a programming circuit 151 configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits 150 can also include a counting circuit 152 configured to obtain a count of memory cells which pass a verify test for the one data state. The control circuits 150 can also include a determination circuit 153 configured to determine, based on an amount by which the count exceeds a threshold, if a programming operation is completed.

For example, FIG. 1B is a block diagram of an example control circuit 150 which comprises the programming circuit 151, the counting circuit 152, and the determination circuit 153.

The off-chip controller 122 may comprise a processor 122*c*, storage devices (memory) such as ROM 122*a* and RAM 122*b*, an error-correction code (ECC) engine 245, and a BSPF engine 246. The ECC engine can correct a number of read errors which are caused when the upper tail of a Vt distribution becomes too high. However, uncorrectable errors may exist in some cases. The techniques provided herein reduce the likelihood of uncorrectable errors. The BSPF engine 246 is configured to dynamically establish BSPF criteria as discussed in further detail below.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Figure 1C:
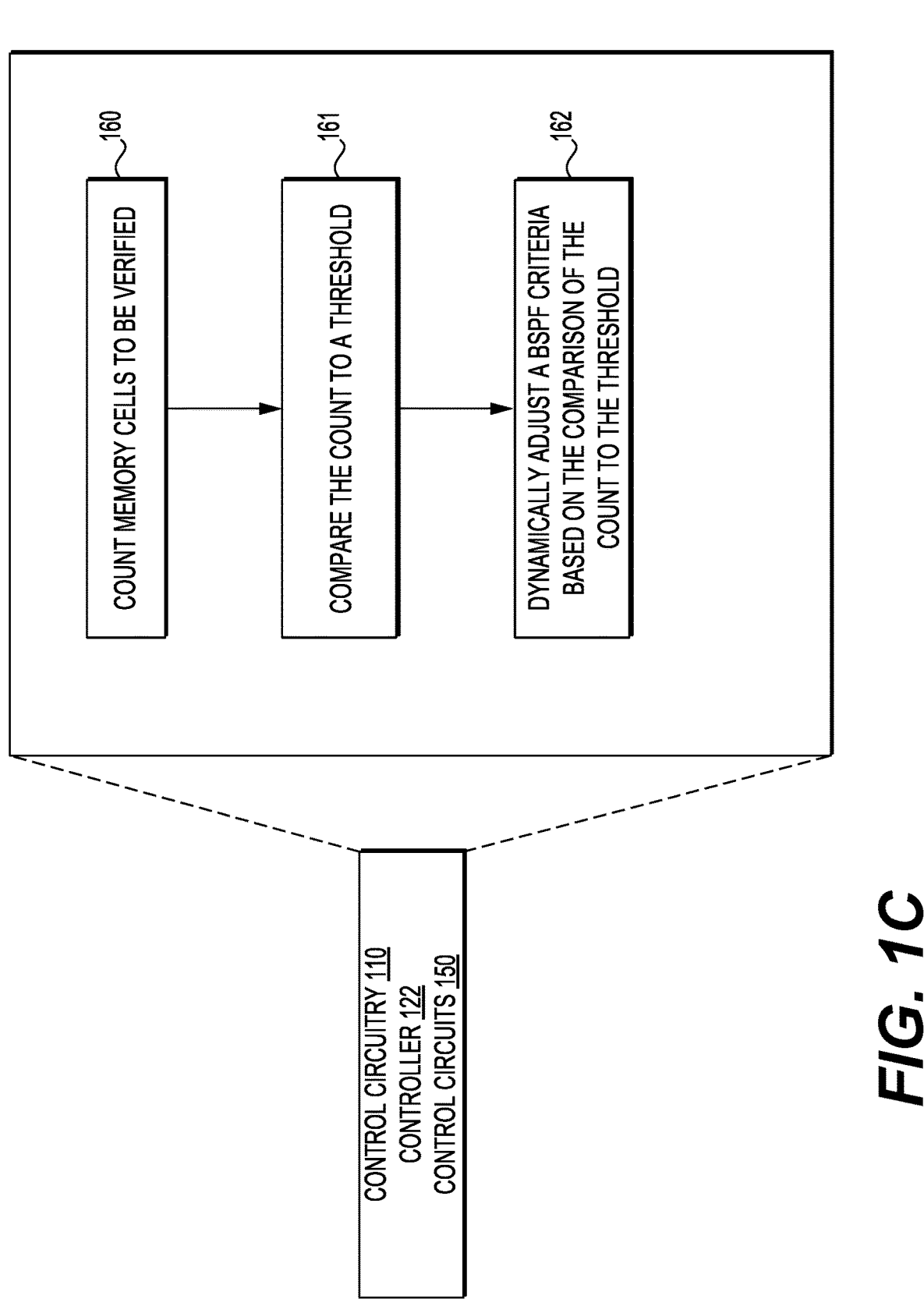
FIG. 1C is a block diagram of example circuitry of the memory device of FIG. 1A.

Generally, the control code can include instructions to perform the functions described herein including the steps of the flowcharts discussed further below and provide the voltage waveforms including those discussed further below. For example, as illustrated in FIG. 1C, the control circuitry 110, controller 122, control circuits 150, and/or any other circuitry are configured/programmed to dynamically establish the BSPF criteria for certain operations, e.g., a smart PCV operation or a smart verify operation. At step 160, the number of memory cells that are going to be verified in an ensuing verify operation are counted to establish a count. At step 161, the count is compared to a threshold. At step 162, the BSPF criteria is dynamically adjusted or set based on the comparison performed in step 161.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates memory blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain-side select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors or between certain data word lines. Such dummy word lines can shield the edge data word line from certain edge effects.

Figures 3A, 3B:
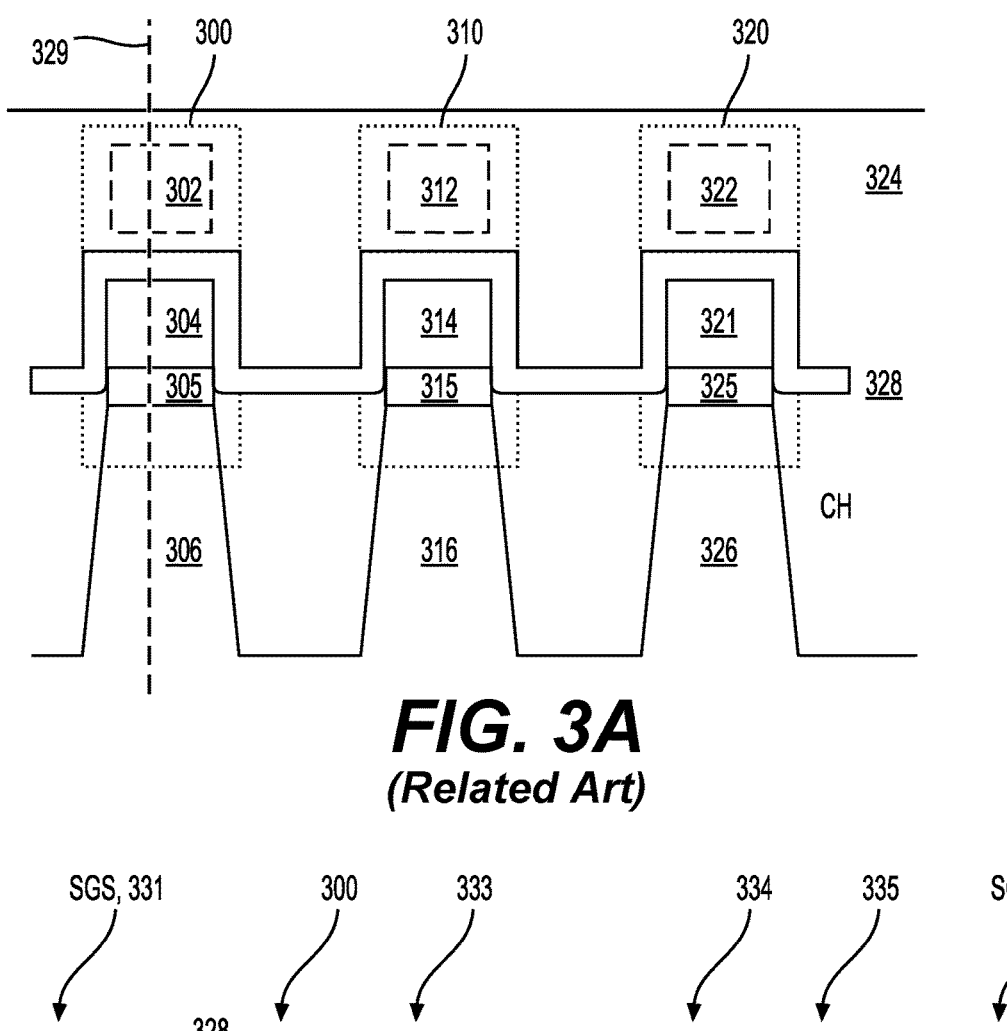
FIG. 3A and FIG. 3B depict cross-sectional views of example floating gate memory cells in NAND strings.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figures 4A, 4B:
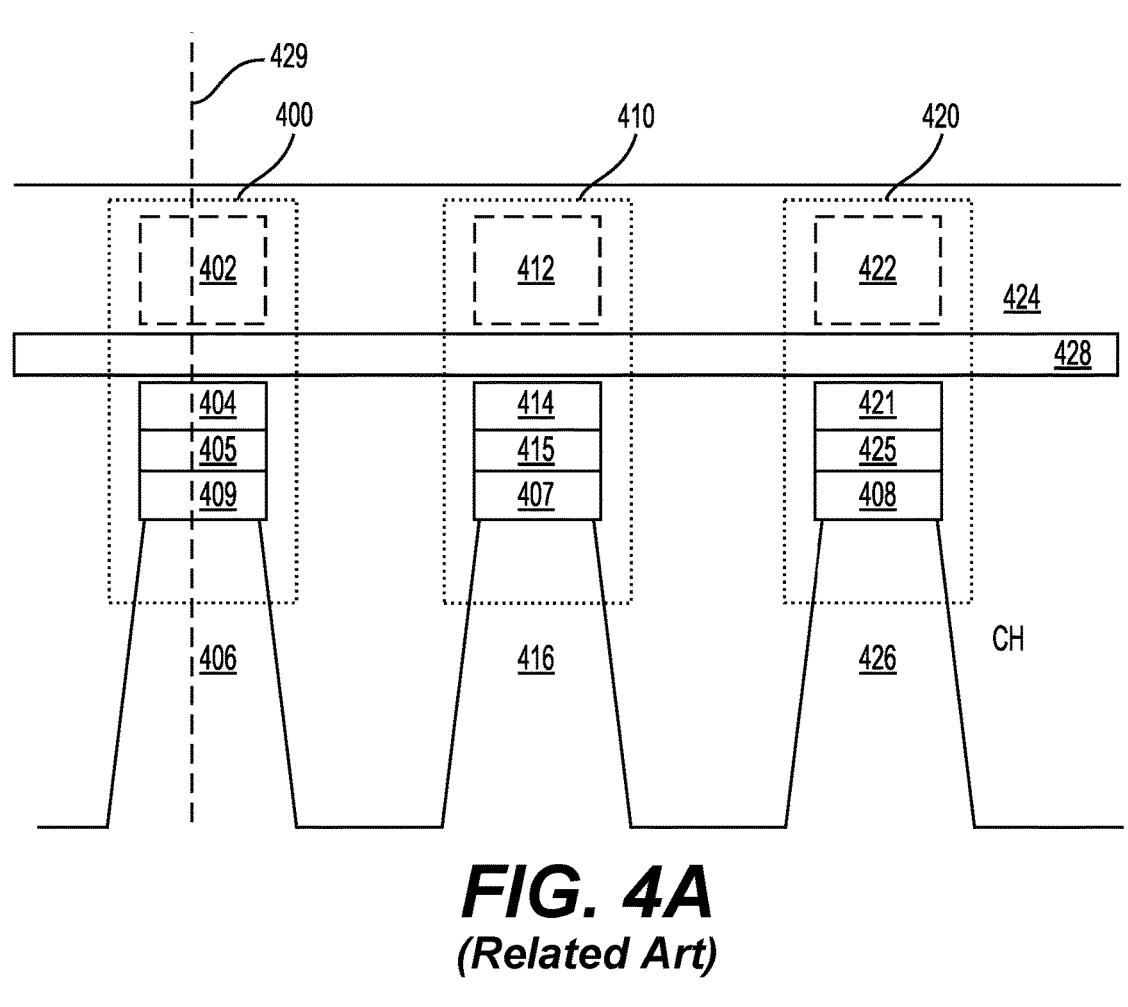
FIG. 4A and FIG. 4B depict cross-sectional views of example charge-trapping memory cells in NAND strings.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
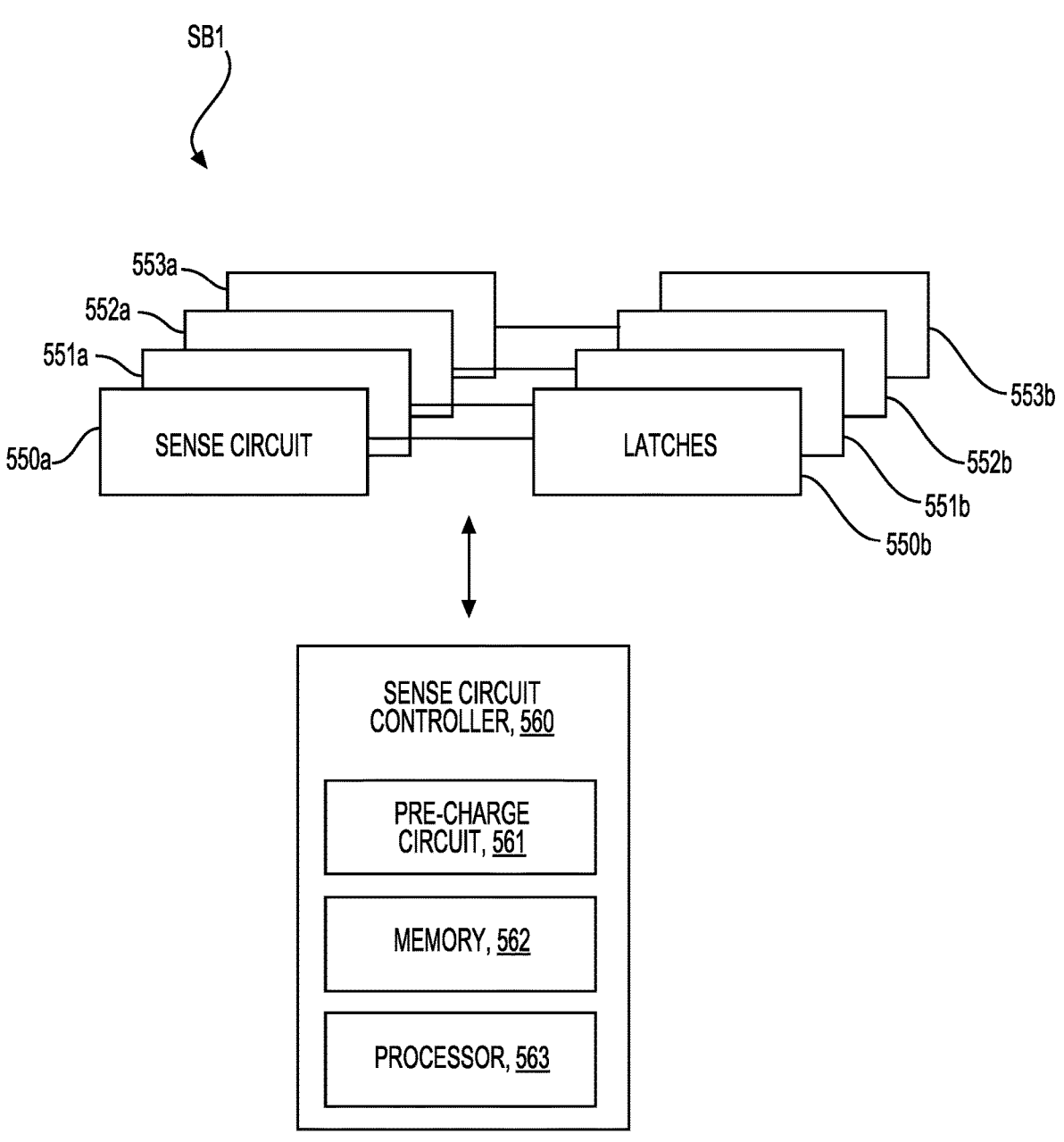
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
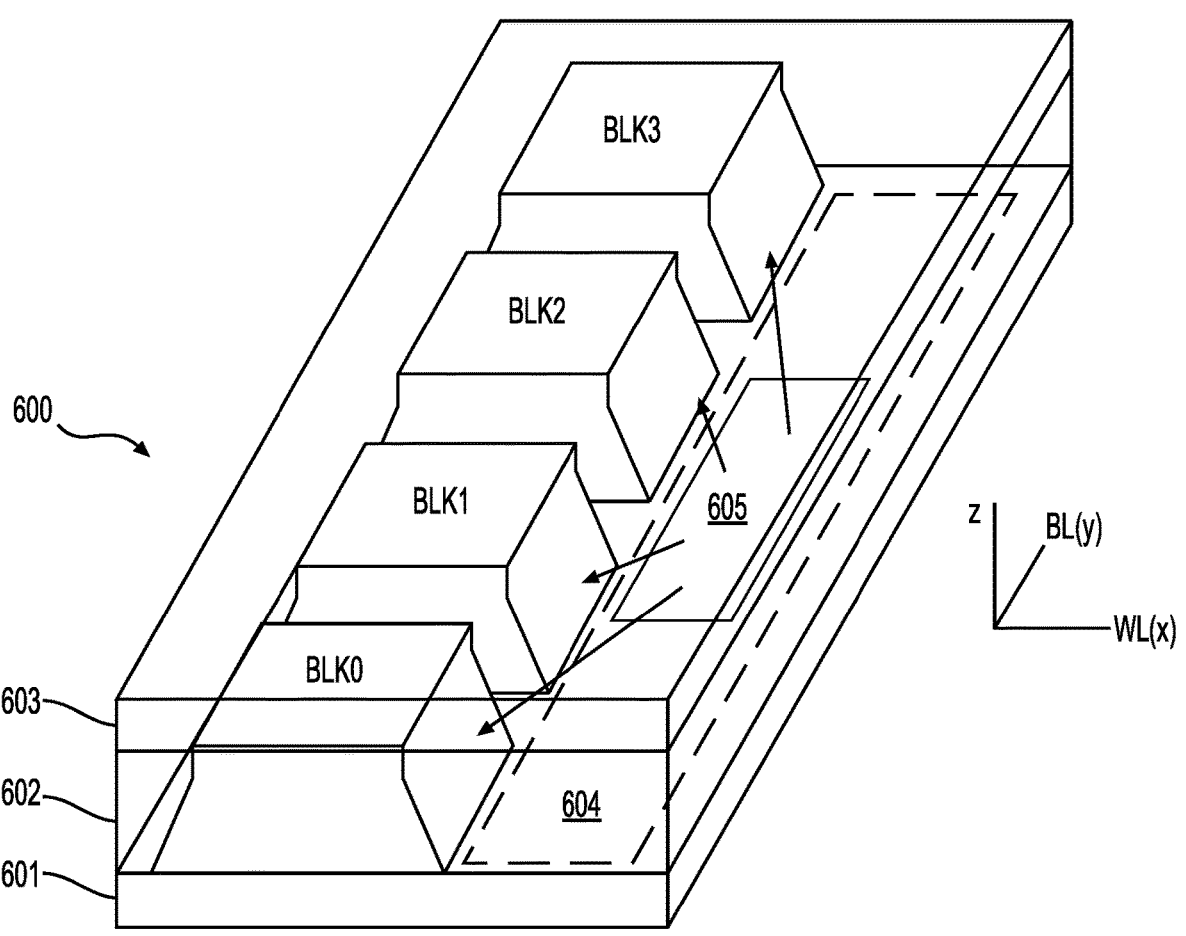
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
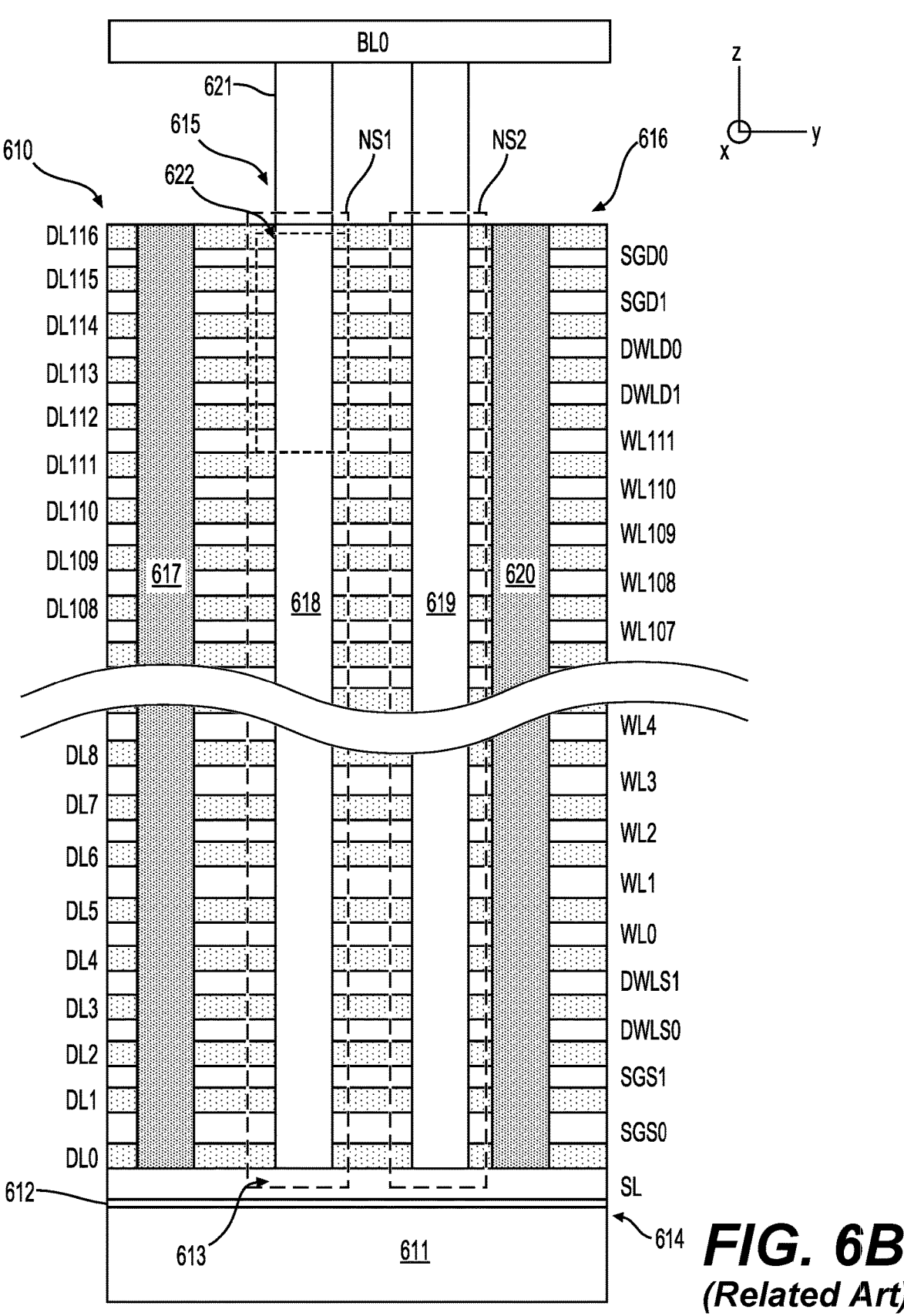
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below. The dielectric layers can have variable thicknesses such that some of the conductive layers can be closer to or further from neighboring conductive layers. The thicknesses of the dielectric layers affects the "ON pitch," which is a factor in memory density. Specifically, a smaller ON pitch allows for more memory cells in a given area but may compromise reliability.

The stack 610 includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
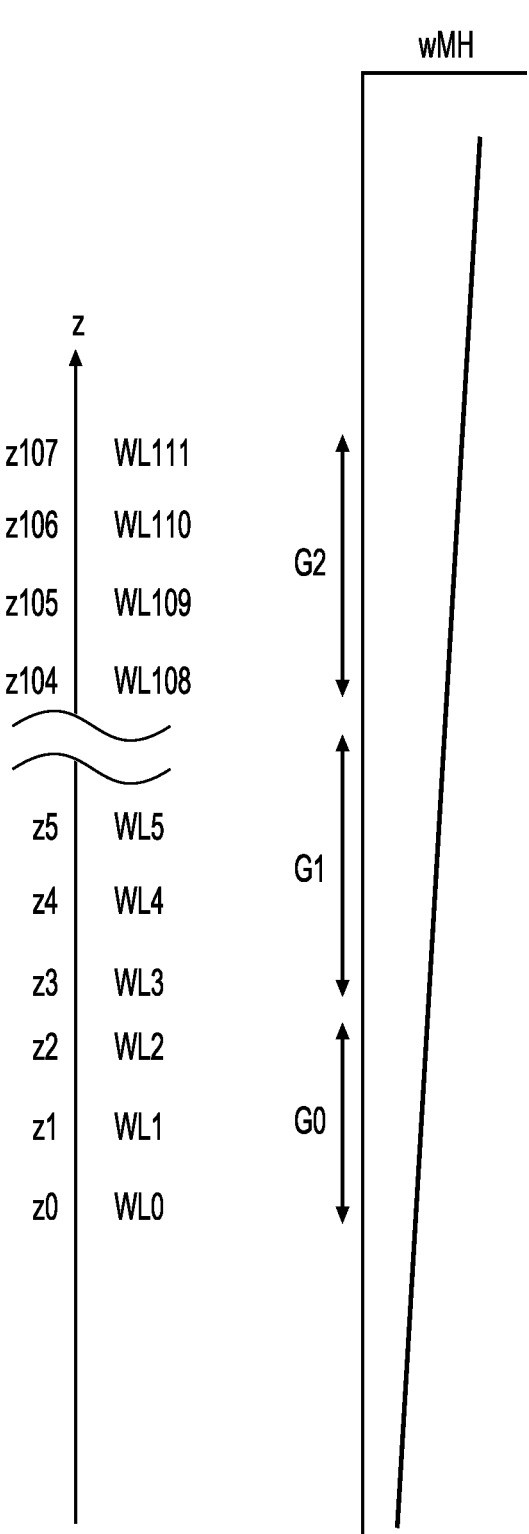
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 6D:
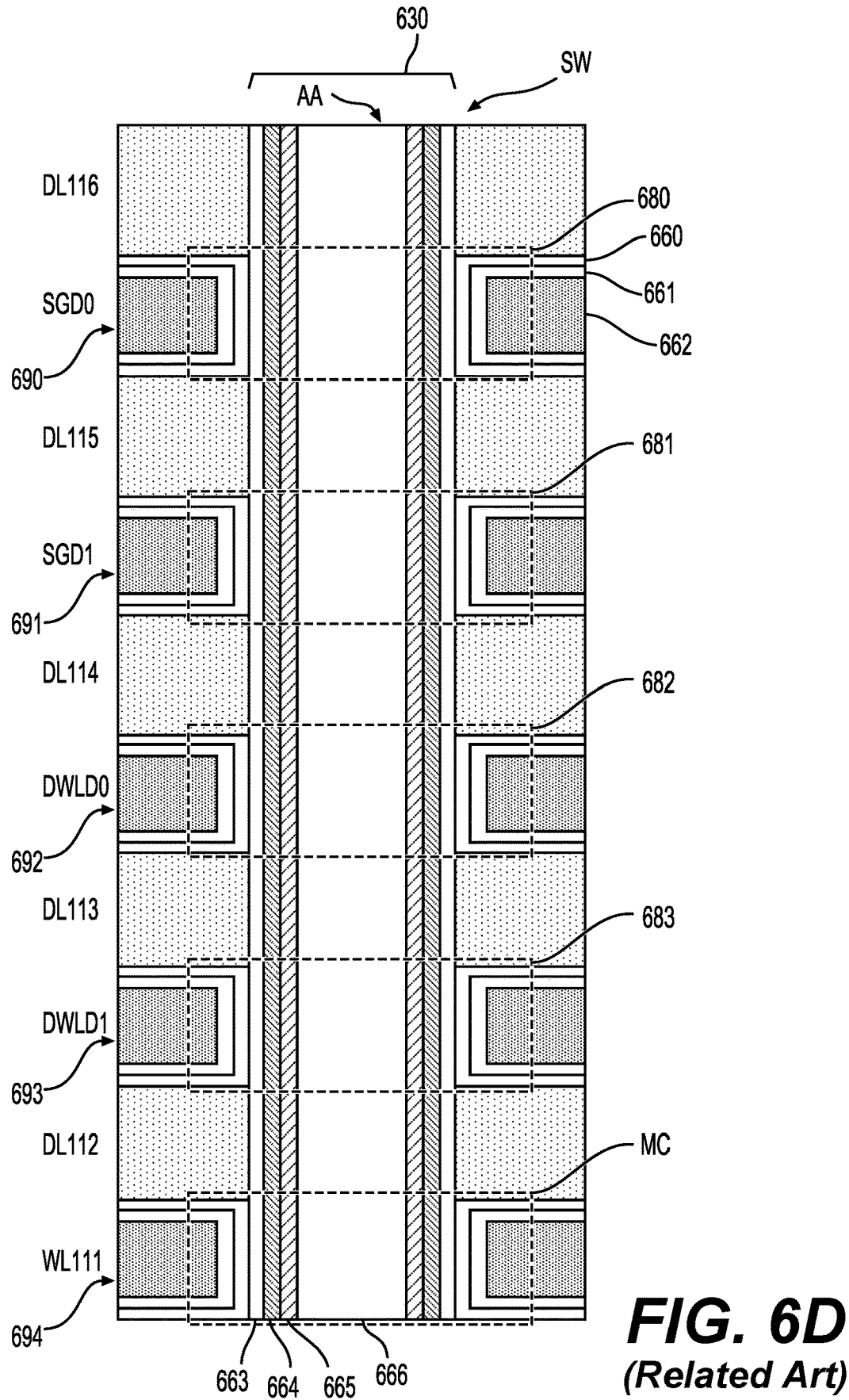
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage Vt of a memory cell is increased in proportion to the amount of stored charge. During a sensing operation, the threshold voltage Vt is detected or measured. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of layers are between the core region and the word line layer in each of the memory holes 630. In some cases, the charge trapping layer 663 and the tunneling layer 664 are annular in shape. In other cases, as discussed in further detail below, these layers are semi-circular in shape.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line during each programming, sensing, or erasing operation.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figures 8, 9:
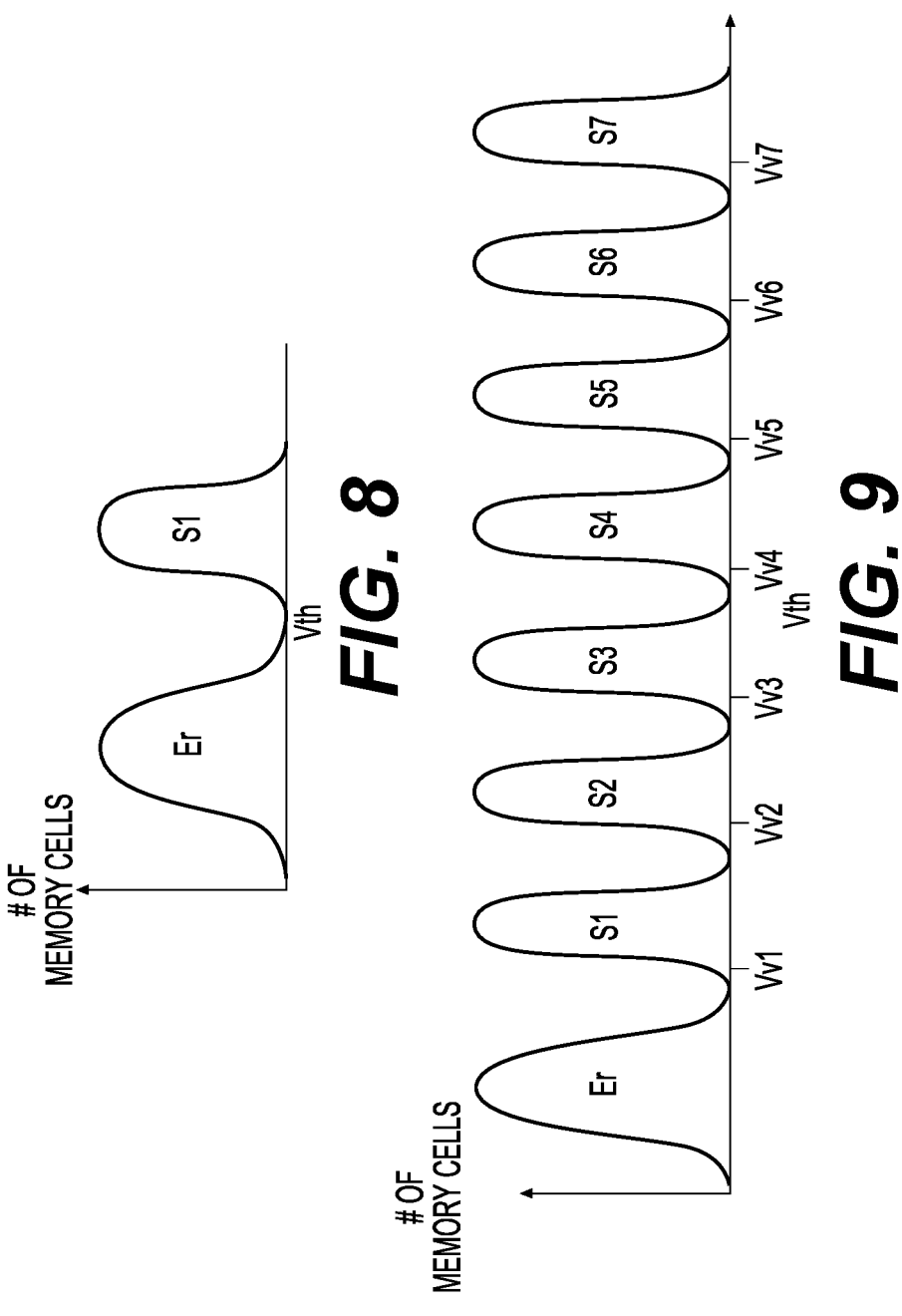
FIG. 8 depicts a threshold voltage distribution of a page of memory cells programmed to one bit per memory cell (SLC)
FIG. 9 depicts a threshold voltage distribution of a page of memory cells programmed to three bits per memory cell (TLC)

The memory cells of the memory blocks can be programmed to store one or more bits of data in multiple data states, each of which is associated with a respective threshold voltage Vt range and with a respective bit or series of bits. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. Similarly, each programmed data state is associated with a unique read voltage that can be the same or different than the respective verify voltages. Other storage schemes are also available, such as two bits per cell (MLC) with four data states, four bits per cell (QLC) with sixteen data states, or five bits per cell (PLC) with thirty-two data states.

Figure 10:
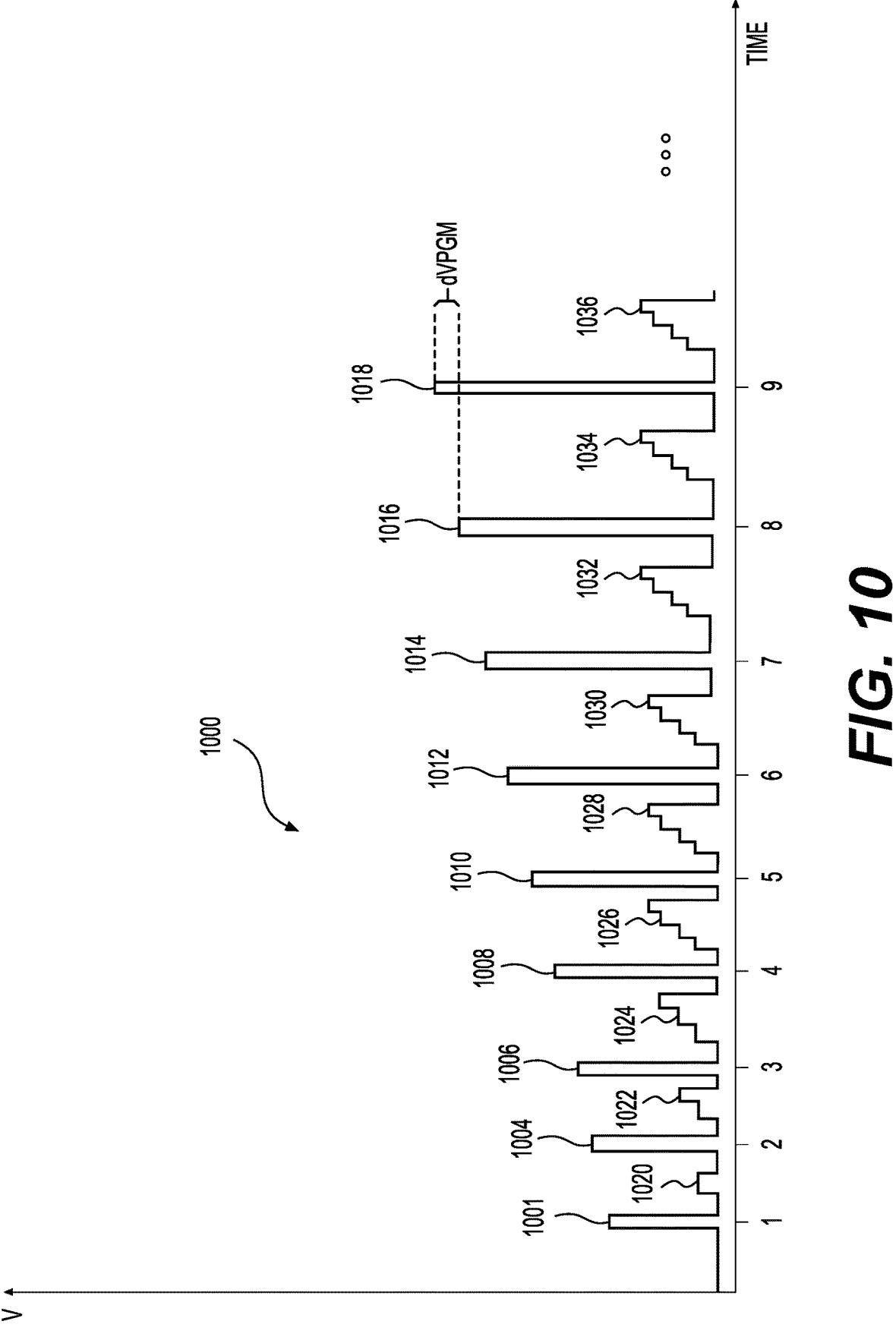
FIG. 10 is a waveform of the voltages applied to a selected word line during an example programming operation.

Programming the memory cells occurs on a string group-by-string group and word line-by-word basis from one side of the memory block towards an opposite side of the memory block. In other words, the strings (for example, four strings) of a first word line are all sequentially programmed one after another, then this is repeated for a second word line, and then a third word line and so on. Typically, programming the memory cells of a selected word line to retain multiple bits per memory cell (for example, MLC, TLC, or QLC) starts with the memory cells being in the erased data state and includes a plurality of program loops to increase the threshold voltages Vt of those memory cells into the appropriate voltage ranges associated with their respective intended data states. Each program loop includes both a programming pulse and a verify operation. FIG. 10 depicts a waveform 1000 of the voltages applied to a selected word line during an example programming operation for programming the memory cells of the selected word line to a greater number of bits per memory cell (e.g., TLC or QLC). As depicted, each program loop includes a programming pulse (hereinafter referred to as a VPGM pulse) and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse voltage steps up, or increases, in each successive program loop. More specifically, the pulse train includes VPGM pulses that increase stepwise in amplitude with each successive program loop by a program voltage step size (dVPGM). A new pulse train starts with the VPGM pulse being at a starting voltage VPGMU and ends with it being at a final VPGM pulse, which does not exceed a maximum allowed voltage. The example pulse train 1000 includes a series of VPGM pulses 1001-1015 that are applied to a control gate of the selected word line to program the memory cells of that word line and that increase in amplitude by the program voltage step size dVPGM between pulses.

One or more verify pulses 1016-1029 are provided after each VPGM pulse, based on the target data states which are being verified in the respective program loops. The verify voltages may be the voltages Vv1-Vv7 shown in FIG. 9. Concurrent with the application of the verify voltages, a sensing operation can determine whether a particular memory cell in the selected word line has a threshold voltage Vt above the verify voltage Vv associated with its intended data state by sensing a current through a string that contains the memory cell. If the memory cell passes verify, programming of that memory cell is completed and further programming of that memory cell is inhibited (or locked out) for all remaining program loops by applying an inhibit voltage to a bit line coupled with the memory cell concurrent with the VPGM pulse and by skipping verify for those memory cells. During a bitscan operation, the memory device determines if programming of one or more of the data states is completed. Programming proceeds until all (or a sufficient number of) memory cells of the selected word line pass verify for their intended states, in which case, programming passes, or until a predetermined maximum number of program loops is exceeded, in which case, programming fails.

Figure 11:
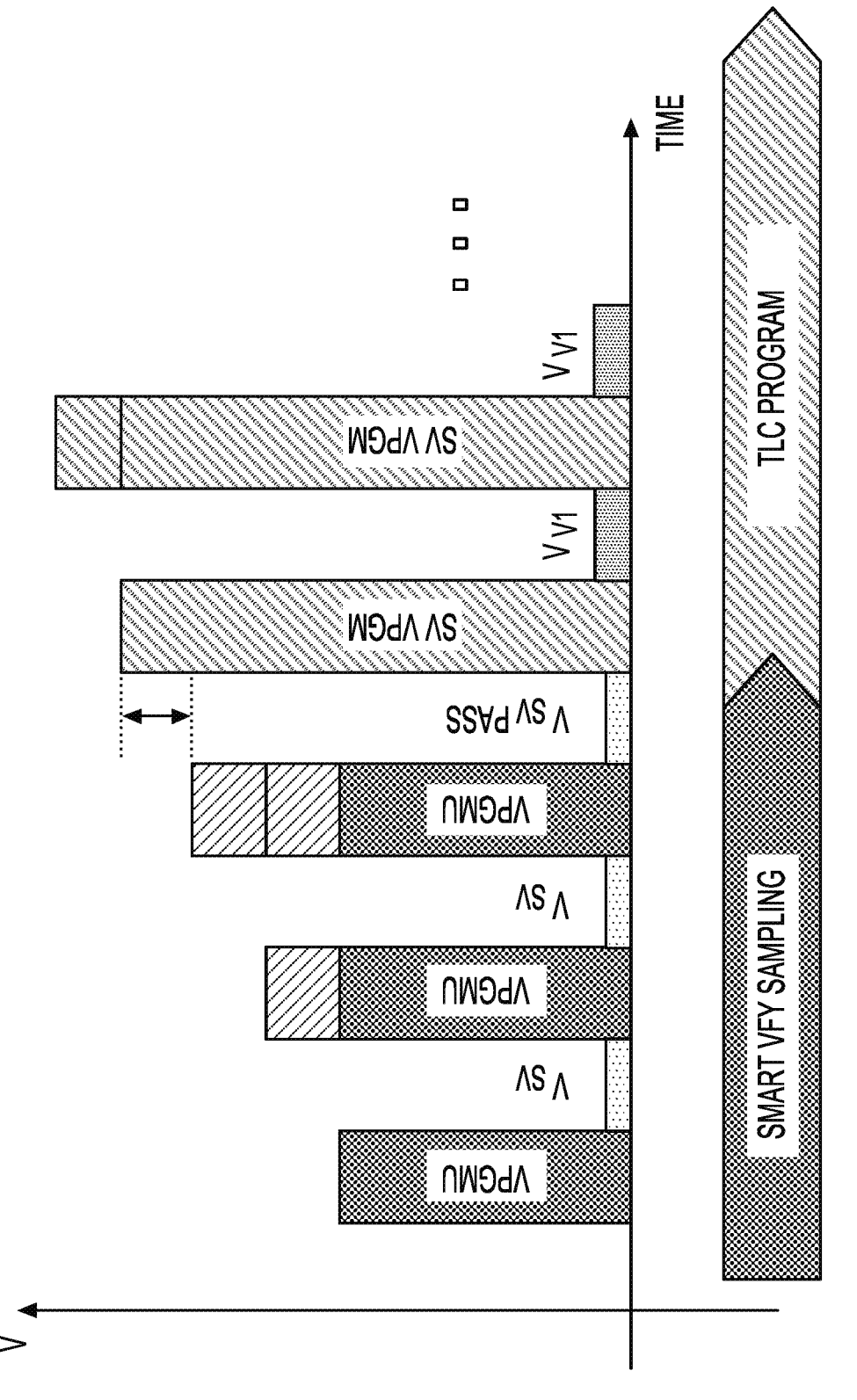
FIG. 11 is a plot of the voltages applied to a selected word line during a smart verify operation.

In some programming operations, a smart verify operation is performed during the first couple of programming loops to improve programming performance (reduce programming time tProg) when programming the other string groups and word lines of the same memory block. During the smart verify program loops, only a portion of the selected word line WLn (for example, one string) is selected to acquire a suitable SV_VPGM voltage, which is then used as the initial programming voltage SV_VPGM during the programming of other word lines or string groups within the same memory block. Smart verify improves performance by optimizing the initial programming voltage SV_VPGMU rather than setting the initial programming voltage at an overly conservative level, which would often require unnecessary program loops, or by setting the initial programming voltage at an overly aggressive level, which could lead to over-programming. During the smart verify process, the programming voltage VPGM starts at a pre-trimmed and conservative initial voltage VPGMU and verify starts with a smart verify voltage Vsv, which is either equal to or lower than a verify voltage for a first programmed data state, e.g., S1. Referring to FIG. 11, during an example TLC program operation, a smart verify operation is performed on the selected word line WLn in each program loop until a predetermined threshold of memory cells, or a BSPF criteria BSPF_SV, have threshold voltages Vt that exceed Vsv verify level as determined by a bitscan operation. Upon the bitscan operation passing failing, the programming voltage VPGM in that program loop is saved to latches as SV_VPGM for later use as an initial programming voltage VPGM for other programming operations on other strings and/or word lines in the memory block. In all following program loops, the verify voltages that are applied during the verify portion are the verify voltages Vv1-Vv7 (or Vv2-Vv7 if the smart verify voltage was Vv1) associated with the programmed data states S1-S7 and verify to Vsv ends in the case of TLC programming. In this example, smart verify fails after three program loops, and in the fourth program loop, the next data state Sn (for example, S1 or S2) is verified using the appropriate verify voltage Vvn. When programming begins for the next string or word line, the programming voltage VPGM that is applied during the VPGM pulse of the first program loop is SV_VPGM.

Verifying every programmed data state (seven data states in the case of TLC programming and fifteen data states in the case of QLC programming) in each program loop would be very time consuming and result in very low performance. Therefore, typically, only one or a few data states are verified in each of the program loops. The specific data states that are verified in each of the program loops can be determined in a number of different ways. In some cases, it is predetermined which data states are programmed in each of the program loops, e.g., data state S1 is always verified in program loops 1-12, data state S2 is always verified in program loops 10-14, data state S3 is always verified in program loops 12-16, and so on. However, there are two potential problems with this approach. First, programming performance can be hindered if verify begins too early for any of the data states, thereby resulting in unnecessary verify operations being performed. Second, over-programming can occur if verify begins too late for any of the data states.

Figures 12A, 12B:
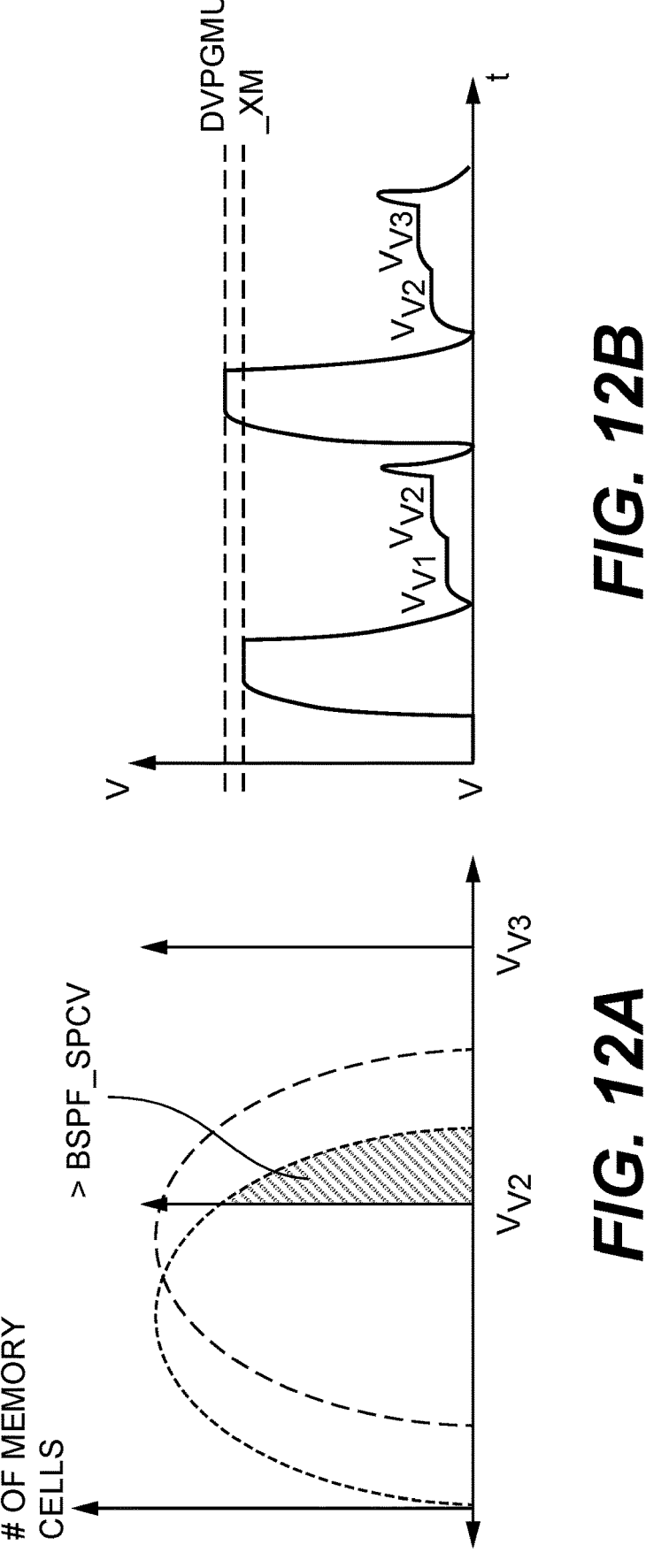
FIG. 12A is a threshold voltage distribution plot of a plurality of memory cells during two program loops of an example smart PCV operation.
FIG. 12B is a waveform of the voltages applied to the selected word line during a pair of program loops of the example smart PCV operation.

One technique, which is sometimes known as "smart PCV," to improve performance while minimizing over-programming is to dynamically determine when to start verifying a next sequential data state based on the results of one of the data states being verified in a given program loop. More specifically, during verify of one data state (for example, data state S1), a bitscan operation using a bit scan pass fail (BSPF) criteria BSPF_SPCV can be performed to measure an upper tail of the data state being programmed (the S1 data state in this example). If the bitscan operation fails, then in the next subsequent program loop, verify begins for the next data state (S2 in this example). In other words, circuitry in the memory device determines that a greater number of memory cells have threshold voltages Vt that are above the verify voltage (Vv1, for example) of the highest data state being programmed (data state S1, for example) than the BSPF criteria BSPF_SPCV, then the bitscan operation fails and the start of verify for the next programmed data state (data state S2, for example) is triggered. An example implementation of smart PCV is illustrated in FIGS. 12A and 12B. In this example, the bitscan operation fails in the first illustrated program loop, thereby triggering verify of the S3 data state in the second illustrated program loop. Smart PCV can be used to dynamically establish which program loops to begin verify of all of the programmed data states, thereby improving programming performance by eliminating some unnecessary verify operations.

However, there still may be a reliability/performance tradeoff when determining where to set the BSPF criteria BSPF_SPCV. If BSPF_SPCV is set at a high level, performance is improved but reliability may be compromised because there is a risk that some over-programming will occur, thereby increasing a fail bit count (FBC). On the other hand, if BSPF_SPCV is set at a low level, performance is reduced but reliability improves as compared to a high level. In many cases, the BSPF criteria BSPF_SPCV used during smart PCV is pre-set at a conservative (low) level to reduce the risk of over-programming at the expense of performance.

A page (e.g., the word line or string group being programmed) can be divided up into tiers, e.g., sixteen (16) tiers. During the bitscan operation, performance can be improved by scanning fewer than all of the tiers of the page. The setting of the BSPF criteria BSPF_SPCV is based on the number of tiers being scanned, e.g., if BSPF_SPCV is set at two hundred and forty (240) for sixteen (16) tier bitscan, then it should be set at one hundred and twenty (120) for an eight tier bitscan. However, while performance is improved by reducing the number of tiers that are scanned, the risk of the data being programmed falling outside of ideal randomization is also increased. If the data is within a certain margin of ideal randomization, then in some cases it may take extra program loops for the BSPF criteria BSPF_SPCV to be triggered and the bitscan to fail. In these scenarios, the risk of over-programming can rise.

According to one aspect of the present disclosure, during programming of the memory cells of a selected word line WLn, the BSPF criteria BSPF_SPCV that is used during a smart PCV operation is dynamically set to further optimize both performance and reliability, even if a low number of tiers are scanned during the bitscan operation. More specifically, according to these techniques, for word lines that might be at a higher risk of over-programming, the BSPF criteria is set at a first (lower) level BSPF_SPCV_L and for word lines that are at a lower risk of over-programming, the BSPF criteria is set at a second (higher) level BSPF_SPCV_H. This offers an improved balance of performance and reliability as compared to other known programming techniques.

According to an exemplary embodiment, the BSPF criteria during a smart PCV operation is set at either at the lower level BSPF_SPCV_L, which improves reliability, or at the higher level BSPF_SPCV_H, which improves performance, based on a count C_S1 of the memory cells being programmed to the first programmed data state S1 during the application of a first VPGM pulse to the selected word line WLn. If the count C_S1 is greater than a predetermined SPCV threshold T_SPCV, then the BSPF criteria is set at the higher level BSPF_SPCV_H to improve performance. Conversely, if the count C_S1 is less than or equal to the smart PCV threshold T_SPCV, then the BSPF criteria is set at the lower level BSPF_SPCV_L to improve reliability by more conservatively establishing when to start verifying data state S2.

This process can be repeated for each of the programmed data states beyond data state S1. For example, during the first VPGM pulse where the data state S2 verified, the number of memory cells being programmed to data state S2 can be counted to establish a count C_S2. If the count C_S2 is greater than a predetermined smart PCV threshold T_SPCV, then the BSPF criteria is set at the higher level BSPF_SPCV_H to improver performance. Conversely, if the count C_S2 is less than or equal to the smart PCV threshold T_SPCV, then the BSPF criteria is set at the lower level BSPF_SPCV_L to improve reliability by more conservatively establishing when to start verifying data state S3. This continues for the remaining programmed data states except a last programmed data state (S7 for TLC programming and S15 for QLC programming).

Figure 13:
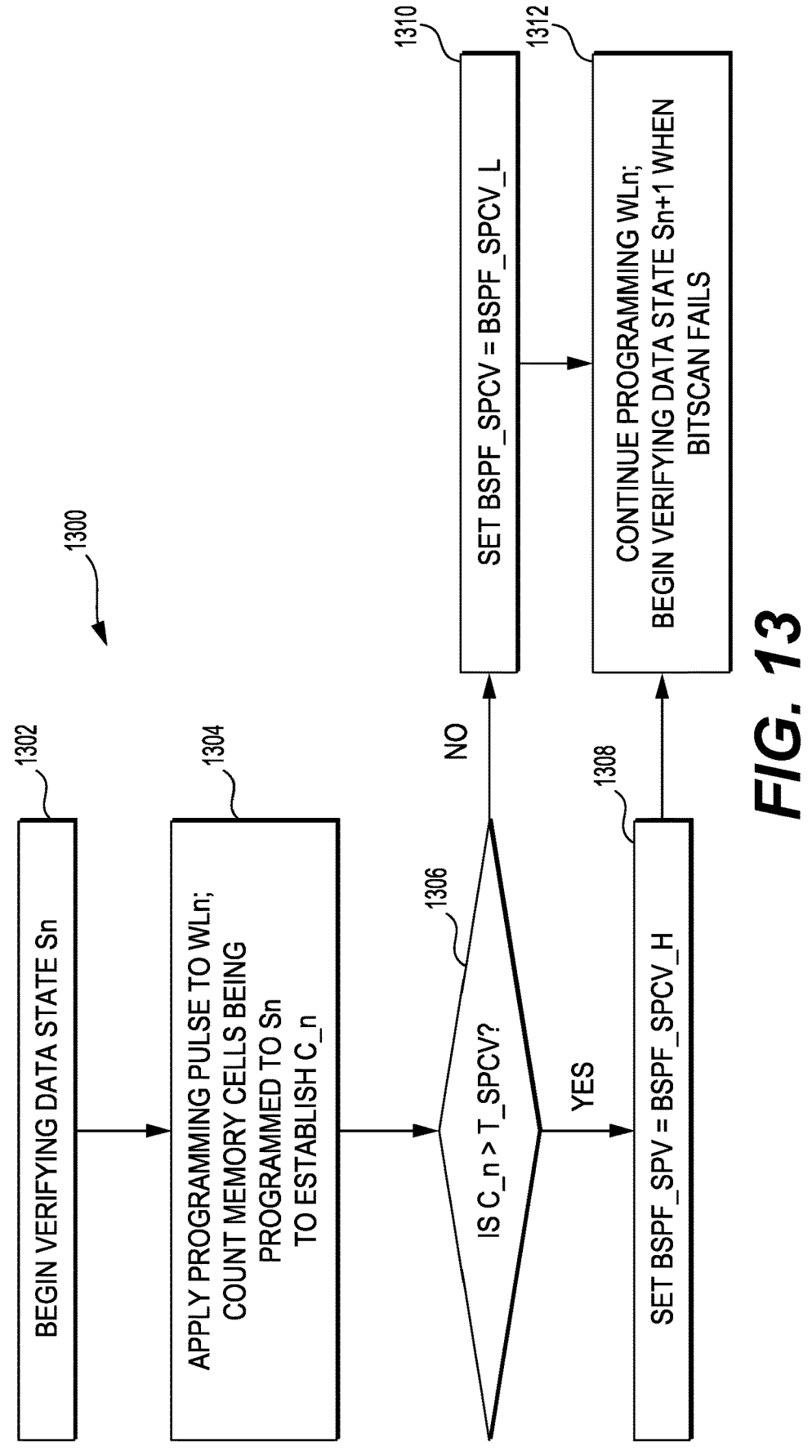
FIG. 13 is a flow chart depicting the steps of a smart PCV operation with a dynamically acquired BSPF criteria according to an example embodiment of the present disclosure.

Turning now to FIG. 13, a flow chart 1300 is provided depicting the steps of programming the memory cells of a selected word line according to an exemplary embodiment of the present disclosure. These steps could be performed by the controller; a processor or processing device or any other circuitry, executing instructions stored in memory; and/or other circuitry described herein that is specifically configured/programmed to execute the following steps.

At step 1302, during a program loop, verify begins for the data state Sn (for example, data state S1). At step 1304, a VPGM pulse at a programming voltage VPGM is applied to the control gate of the selected word line WLn. Concurrent with the application of the VPGM pulse, the memory cells that are being programmed to the data state Sn are counted to establish a count C_n.

At decision step 1306, it is determined if the count C_n is greater than a smart PCV threshold T_SPCV. If the answer at decision step 1306 is "yes," then at step 1308, the BSPF criteria BSPF_SPCV is set at a high level BSPF_SPV_H, i.e., BSPF_SPV=BSPF_SPCV_H. If the answer at decision step 1306 is "no," then at step 1310, the BSPF criteria BSPF_SPCV is set at the low level BSPF_SPCV_L, i.e., BSPF_SPCV_L. Following either step 1308 or step 1310, the process proceeds to step 1312. At step 1312, programming continues for the selected word line WLn. Verify of the next sequential data state Sn+1 begins when the bitscan operation employing the dynamically set BSPF criteria BSPF_SPCV fails.

These steps can be repeated for each programmed data state except the last programmed data state (because there is no following data state to begin verify for), i.e., S1-S6 in the case of TLC programming and S1-S14 in the case of QLC programming. By following these steps, both performance and reliability are optimized by maximizing the number of verify operations that can be skipped by setting the BSPF threshold at the high level BSPF_SPCV_H in some word lines while ensuring that the BSPF threshold is set at the more conservative low level BSPF_SPCV_L when necessary to minimize the FBC in other word lines.

Another aspect of the present disclosure is related to a programming technique wherein during a first VPGM pulse, a bitscan criteria BSPF_SV for a smart verify operation is dynamically determined based on a count C_SV of the number of memory cells that are to be verified during ensuing the smart verify operation. By dynamically determining the bitscan criteria BSPF_SV that is utilized during the smart verify operation, the smart verify voltage VPGM_SV can be more accurately established to improve programming performance with a reduced loss of reliability.

Figure 14:
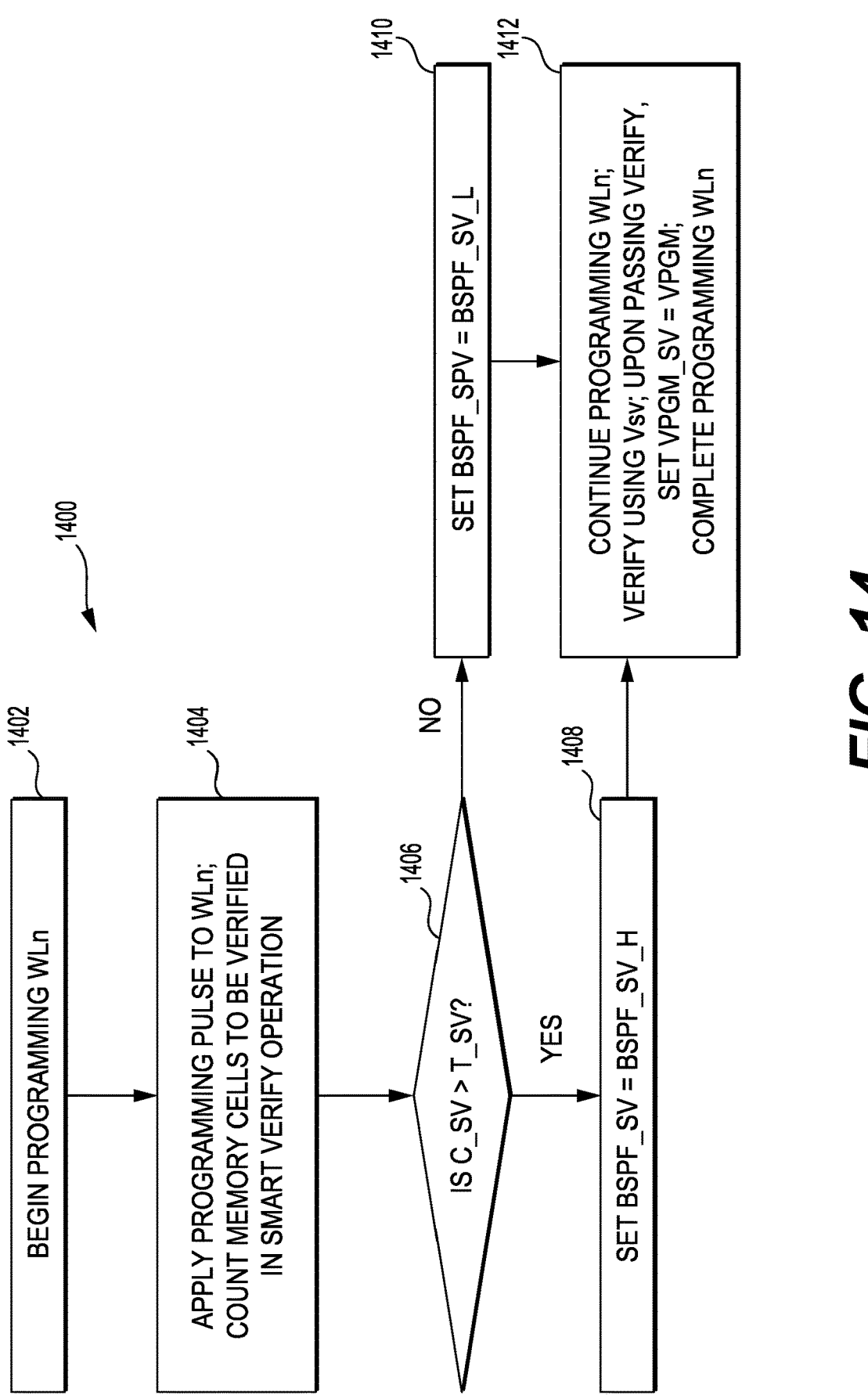
FIG. 14 is a flow chart depicting the steps of a smart verify operation with a dynamically acquired BSPF criteria according to another example embodiment of the present disclosure.

Turning now to FIG. 14, a flow chart 1400 is provided depicting the steps of programming the memory cells of a selected word line WLn according to an exemplary embodiment of the present disclosure. These steps could be performed by the controller; a processor or processing device or any other circuitry, executing instructions stored in memory; and/or other circuitry described herein that is specifically configured/programmed to execute the following steps. In some embodiments, the number of tiers to be scanned during the bitscan operation is pre-set so that the bitscan operation is only performed during the VPGM pulse.

At step 1402, programming at least a portion of the selected word line WLn begins. For example, in some embodiments, step 1402 could begin the programming of one string of the selected word line WLn but not the other strings. At step 1404, the smart verify operation begins with the application of a first VPGM pulse to the selected word line WLn. Also at this step, the memory cells that are going to be verified using the smart verify voltage Vsv are counted to establish a count C_SV. The counting can occur at least partially concurrent with the application of the VPGM pulse to the selected word line WLn.

At decision step 1406, it is determined if the count C_SV is greater than a smart verify threshold T_SV. If the answer at decision step 1406 is "yes," then at step 1408, the BSPF criteria BSPF_SV for the ensuing smart verify operations is set at a high level BSPF_SV_H. If the answer at decision step 1406 is "no," then at step 1410, the BSPF criteria BSPF_SV is set at a low level BSPF_SV_H, which is less than the high level BSPF_SV_H.

Figures 15, 16:
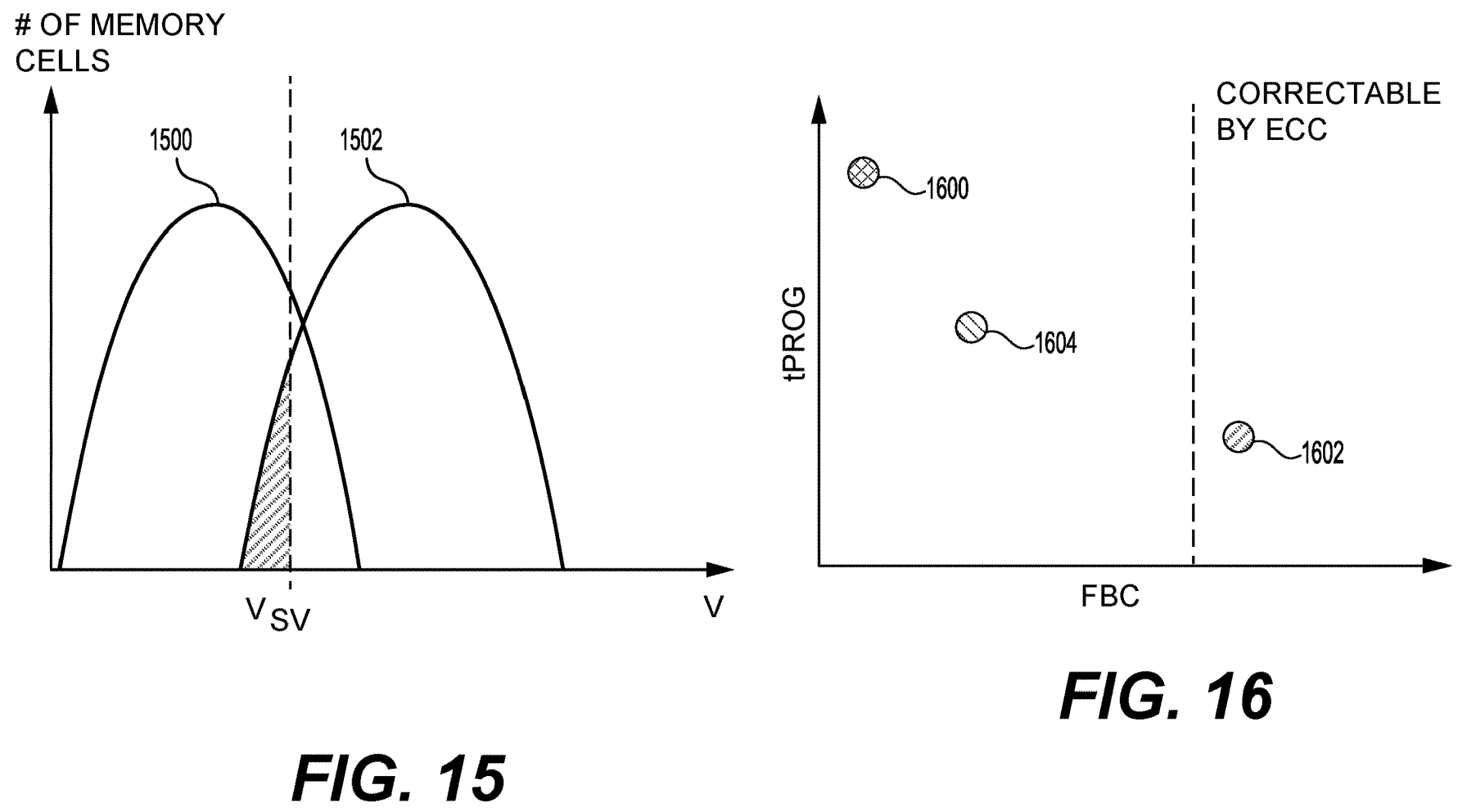

Following either step 1408 or step 1410, at step 1412, programming of the selected word line WLn continues in one or more program loops. During the initial program loops, the memory cells of the selected word line WLn are verified using the smart verify voltage Vsv and with the BSPF criteria BSPF_SV being employed to determine if verify passes or fails. FIG. 15 illustrates an example plot of the threshold voltage Vt distribution of a plurality of memory cells being programmed in the initial program loops. In this example, verify fails in the first program loop (curve 1500) because a greater number of memory cells have threshold voltages Vt that are below the smart verify voltage Vsv than the BSPF criteria BSPF_SV. However, verify passes in the second program loop (curve 1502) because fewer memory cells have threshold voltages Vt that are below the smart verify voltage Vsv than the BSPF criteria BSPF_SV.

Upon verify passing, then the programming voltage VPGM that was used in the VPGM pulse of that program loop is set as the smart verify voltage VPGM_SV. Programming the memory cells of the selected word line WLn then proceeds until completion. The smart verify voltage VPGM_SV can then be used as the initial programming voltage when programming the memory cells of other strings of the selected word line WLn and/or when programming the memory cells of other word lines in the same memory block.

FIG. 16 is a plot that depicts performance versus reliability in an example using three different programming techniques: a conservative technique 1600, an aggressive technique 1602 and a technique 1604 where the smart verify BSPF criteria and the smart PCV BSPF criteria are dynamically set. Typically, there is a substantial trade-off between performance and reliability. In other words, a choice must be made between high performance with low reliability (technique 1602) or high reliability with low performance (technique 1600). By employing the technique 1604, performance can be improved (lower programming time tProg) with a small decrease in reliability such that the FBC remains below a level that can be corrected by the ECC engine.

In the example embodiments of FIGS. 13 and 14 discussed above, the count (C_n or C_SV) is only compared to a single threshold (T_SPCV or T_SV) and the respective BSPF threshold is set at either a high level or a low level. However, in some embodiments, the count can be compared against a plurality of thresholds that are associated count ranges, each of which is associated with a unique BSPF threshold, to improve accuracy. For example, in one embodiment depicted in the Table of FIG. 17, there are sixteen (16) zones or bit count ranges. When the count C_n is determined, it is compared to a plurality of thresholds, which serve as the boundaries between these zones, to determine which zone the count is in. Each zone is associated with a unique BSPF threshold (BSPF_SPCV in this example embodiment but BSPF_SV in other embodiments), i.e., there are more than two BSPF threshold options. The illustrated BSPF thresholds are illustrated as fractions times a baseline BSPF threshold. For example, if the count C_n is in Zone 8, then the BSPF threshold BSPF_SPCV is set at the baseline BSPF_SPCV. However, if the count C_n is in Zone 4 [between U*(3.5/8) and U*(4.5/8) where U is an expected or baseline count value], then there are very few memory cells being programmed to data state Sn and the BSPF threshold BSPF_SPCV is set at ½ of the baseline BSPF threshold. Similarly, if the count C_n is in Zone 15 [between U*(14.5/8) and U*(15.5/8)], then there are a lot of memory cells being programmed to data state Sn and the BSPF threshold BSPF_SPCV is set at 15/8 of the baseline BSPF threshold, i.e., nearly double the baseline BSPF threshold. In some embodiments, there can be more or fewer than sixteen zones. Further, the boundaries between the zones can be set at any suitable levels to improve accuracy.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of performing a programming operation in a memory device, comprising the steps of:

preparing a memory block that includes an array of memory cells that are arranged in a plurality of word lines;

in a program loop that includes the application of a programming pulse and at least one verify pulse to a selected word line, determining a number of memory cells to be verified to establish a verify count;

comparing the verify count to a predetermined threshold count; and setting at least one bit scan pass fail (BSPF) criteria based on the comparison of the verify count to the predetermined threshold count.

2. The method as set forth in claim 1, wherein the at least one BSPF criteria is a smart verify BSPF criteria BSPF_SV.

3. The method as set forth in claim 2, wherein the step of setting the smart verify BSPF criteria BSPF_SV based on the verify count to the predetermined threshold count includes:

in response to the verify count being less than the predetermined threshold count, setting the smart verify BSPF criteria BSPF_SV at a low level BSPF_SV_L, in response to the verify count being greater than the predetermined threshold count, setting the smart verify BSPF criteria BSPF_SV at a high level BSPF_SV_H, and wherein the high level BSPF_SV_H is greater than the low level BSPF_SV_L.

4. The method as set forth in claim 3, wherein the at least one verify pulse is at a smart verify voltage and further including the steps of:

performing a bitscan operation to count a number of memory cells in the selected word line that have threshold voltages below the smart verify voltage;

comparing the number of memory cells that have threshold voltages below the smart verify voltage to the smart verify BSPF criteria BSPF_SV;

in response to the number of memory cells that have threshold voltages below the smart verify voltage being greater than the smart verify BSPF criteria BSPF_SV, performing another program loop with at least one verify pulse at the smart verify voltage; and in response to the number of memory cells that have threshold voltages below the smart verify voltage being less than the smart verify BSPF criteria VSPF_SV, setting a programming voltage VPGM as a smart verify voltage VPGM_SV to be used as an initial programming voltage during programming of other word lines of the plurality of word lines.

5. The method as set forth in claim 1, wherein the at least one BSPF criteria is a smart program count verify (PCV) criteria BSPF_SPCV.

6. The method as set forth in claim 5, wherein the step of setting the smart PCV criteria BSPF_SPCV based on the verify count to the predetermined threshold count includes:

in response to the verify count being less than the predetermined threshold count, setting the smart PCV criteria BSPF_SPCV at a low level BSPF_SPCV_L, in response to the verify count being greater than the predetermined threshold count, setting the smart PCV criteria BSPF_SPCV at a high level BSPF_SPCV_H, and wherein the high level BSPF_SPCV_H is greater than the low level BSPF_SPCV_L.

7. The method as set forth in claim 6, wherein the at least one verify pulse is a first verify voltage that is associated with a first programmed data state and further including the steps of:

performing a bitscan operation to count a number of memory cells in the selected word line that have threshold voltages below the first verify voltage;

comparing the number of memory cells that have threshold voltages above the first verify voltage to the smart PCV BSPF criteria BSPF_SPCV;

in response to the number of memory cells that have threshold voltages above the first verify voltage being greater than the smart PCV BSPF criteria BSPF_SPCV, beginning verify of a second programmed data state in a next program loop, the second programmed data state being associated with a voltage range that is higher than the first programmed data state; and in response to the number of memory cells that have threshold voltages above the first verify voltage being less than the smart PCV BSPF criteria BSPF_SPCV, not beginning verify of the second programmed data state in the next program loop.

8. The method as set forth in claim 1, wherein the step of determining the number of memory cells to be verified to establish the verify count at least partially occurs during the application of the programming pulse to the selected word line.

9. A memory device, comprising:

a memory block that includes an array of memory cells that are arranged in a plurality of word lines;

circuitry that is configured to program the memory cells of a selected word line of the plurality of word lines in a plurality of program loops, during at least one of the program loops, the circuitry being configured to:

apply a programming pulse and at least one verify pulse to the selected word line;

determine a number of memory cells to be verified to establish a verify count;

compare the verify count to a predetermined threshold count; and set at least one bit scan pass fail (BSPF) criteria based on the comparison of the verify count to the predetermined threshold count.

10. The memory device as set forth in claim 9, wherein the at least one BSPF criteria is a smart verify BSPF criteria BSPF_SV.

11. The memory device as set forth in claim 10, wherein while setting the smart verify BSPF criteria BSPF_SV based on the verify count to the predetermined threshold count, the circuitry is configured to:

in response to the verify count being less than the predetermined threshold count, set the smart verify BSPF criteria BSPF_SV at a low level BSPF_SV_L, in response to the verify count being greater than the predetermined threshold count, set the smart verify BSPF criteria BSPF_SV at a high level BSPF_SV_H, and wherein the high level BSPF_SV_H is greater than the low level BSPF_SV_L.

12. The memory device as set forth in claim 11, wherein the at least one verify pulse is at a smart verify voltage and the circuitry is further configured to:

perform a bitscan operation to count a number of memory cells in the selected word line that have threshold voltages below the smart verify voltage;

compare the number of memory cells that have threshold voltages below the smart verify voltage to the smart verify BSPF criteria BSPF_SV;

in response to the number of memory cells that have threshold voltages below the smart verify voltage being greater than the smart verify BSPF criteria BSPF_SV, perform another program loop with at least one verify pulse at the smart verify voltage; and in response to the number of memory cells that have threshold voltages below the smart verify voltage being less than the smart verify BSPF criteria VSPF_SV, set a programming voltage VPGM as a smart verify voltage VPGM_SV to be used as an initial programming voltage during programming of other word lines of the plurality of word lines.

13. The memory device as set forth in claim 9, wherein the at least one BSPF criteria is a smart program count verify (PCV) criteria BSPF_SPCV.

14. The memory device as set forth in claim 13, wherein when setting the smart PCV criteria BSPF_SPCV based on the verify count to the predetermined threshold count, the circuitry is configured to:

in response to the verify count being less than the predetermined threshold count, set the smart PCV criteria BSPF_SPCV at a low level BSPF_SPCV_L, in response to the verify count being greater than the predetermined threshold count, set the smart PCV criteria BSPF_SPCV at a high level BSPF_SPCV_H, and wherein the high level BSPF_SPCV_H is greater than the low level BSPF_SPCV_L.

15. The memory device as set forth in claim 14, wherein the at least one verify pulse is a first verify voltage that is associated with a first programmed data state and wherein the circuitry is further configured to:

perform a bitscan operation to count a number of memory cells in the selected word line that have threshold voltages below the first verify voltage;

compare the number of memory cells that have threshold voltages above the first verify voltage to the smart PCV BSPF criteria BSPF_SPCV;

in response to the number of memory cells that have threshold voltages above the first verify voltage being greater than the smart PCV BSPF criteria BSPF_SPCV, begin verify of a second programmed data state in a next program loop, the second programmed data state being associated with a voltage range that is higher than the first programmed data state; and in response to the number of memory cells that have threshold voltages above the first verify voltage being less than the smart PCV BSPF criteria BSPF_SPCV, not begin verify of the second programmed data state in the next program loop.

16. The memory device as set forth in claim 9, wherein the circuitry is configured to determine the number of memory cells to be verified to establish the verify count at least partially simultaneous to the application of the programming pulse to the selected word line.

17. An apparatus, comprising:

a memory block that includes an array of memory cells that are arranged in a plurality of word lines;

a programming means for programming the memory cells of a selected word line of the plurality of word lines in a plurality of program loops, during at least one of the program loops, the programming means being configured to:

apply a programming pulse and at least one verify pulse to the selected word line;

determine a number of memory cells to be verified to establish a verify count;

compare the verify count to a predetermined threshold count; and set at least one bit scan pass fail (BSPF) criteria as one of at least two BSPF criteria options based on the comparison of the verify count to the predetermined threshold count.

18. The apparatus as set forth in claim 17, wherein the at least one BSPF criteria is a smart verify BSPF criteria BSPF_SV.

19. The apparatus as set forth in claim 17, wherein the at least one BSPF criteria is a smart program count verify (PCV) criteria BSPF_SPCV.

20. The apparatus as set forth in claim 17, wherein the circuitry is configured to determine the number of memory cells to be verified to establish the verify count at least partially simultaneous to the application of the programming pulse to the selected word line.

* * * * *